(12) United States Patent
Nakamura et al.

(10) Patent No.: US 8,248,128 B2
(45) Date of Patent: Aug. 21, 2012

(54) SEMICONDUCTOR DEVICE

(75) Inventors: Kazutoshi Nakamura, Kanagawa-ken (JP); Toru Takayama, Tokyo (JP); Yuki Kamata, Kanagawa-ken (JP); Akio Nakagawa, Kanagawa-ken (JP); Yoshinobu Sano, Tokyo (JP); Toshiyuki Naka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/110,971

(22) Filed: May 19, 2011

(65) Prior Publication Data
US 2011/0221409 A1    Sep. 15, 2011

Related U.S. Application Data

(62) Division of application No. 12/986,500, filed on Jan. 7, 2011, now Pat. No. 7,973,580, which is a division of application No. 12/351,426, filed on Jan. 9, 2009, now Pat. No. 7,893,744.

(30) Foreign Application Priority Data

| Jan. 11, 2008 | (JP) | 2008-004894 |
| Apr. 28, 2008 | (JP) | 2008-117491 |
| Nov. 21, 2008 | (JP) | 2008-298025 |

(51) Int. Cl.
*H03K 3/017* (2006.01)

(52) U.S. Cl. ........................ 327/172; 323/282

(58) Field of Classification Search ................. None
See application file for complete search history.

(56) References Cited

U.S. PATENT DOCUMENTS

| 5,880,644 | A | 3/1999 | Schmidt et al. |
| 6,181,123 | B1 | 1/2001 | Jou et al. |
| 6,310,913 | B1 | 10/2001 | Ishikawa |
| 6,452,432 | B2 | 9/2002 | Kim |
| 6,546,048 | B1 | 4/2003 | Ichiba et al. |
| 7,426,123 | B2 * | 9/2008 | Leung et al. ............ 363/41 |
| 7,439,787 | B2 | 10/2008 | Hashim et al. |
| 7,459,951 | B2 | 12/2008 | Prodic |

(Continued)

FOREIGN PATENT DOCUMENTS

JP        2-296410        12/1990

(Continued)

OTHER PUBLICATIONS

Yang Zhang, et al., "Current Sharing in Digitally Controlled Masterless Multi-Phase DC-DC Converters", Power Electronics Specialists Conference, 2005, PESC '05, IEEE 36th, pp. 2722-2728.

(Continued)

*Primary Examiner* — Cassandra Cox
(74) *Attorney, Agent, or Firm* — Oblon, Spivak, McClelland, Maier & Neustadt, L.L.P.

(57) ABSTRACT

A semiconductor device includes: a voltage-control-type clock generation circuit having a plurality of stages of first delay elements and whose oscillation frequency is controlled according to a control voltage applied to the first delay elements; a delay circuit having a plurality of stages of second delay elements connected serially; and a selection circuit selecting one from pulse signals output by the plurality of stages of respective second delay elements. The first delay elements and the second delay elements have a same structure formed on a same semiconductor substrate, and a delay amount of the second delay elements is adjusted according to the control voltage.

10 Claims, 32 Drawing Sheets

U.S. PATENT DOCUMENTS

| | | | |
|---|---|---|---|
| 7,528,640 B2 | 5/2009 | Huang et al. | |
| 7,554,372 B1 | 6/2009 | Wong | |
| 7,656,136 B2 * | 2/2010 | Chang | 323/224 |
| 7,667,625 B2 | 2/2010 | Prodic et al. | |
| 7,675,757 B2 * | 3/2010 | Nakamura | 363/15 |
| 7,710,092 B2 * | 5/2010 | Chapuis et al. | 323/282 |
| 7,710,174 B2 | 5/2010 | Prodi et al. | |
| 7,791,387 B1 | 9/2010 | Wong | |
| 7,902,803 B2 * | 3/2011 | Peng et al. | 323/283 |
| 2005/0280458 A1 | 12/2005 | Leung et al. | |
| 2006/0055574 A1 * | 3/2006 | Maksimovic et al. | 341/155 |
| 2006/0152204 A1 * | 7/2006 | Maksimovic et al. | 323/284 |
| 2006/0227861 A1 | 10/2006 | Maksimovic et al. | |
| 2006/0239046 A1 * | 10/2006 | Zane et al. | 363/65 |
| 2007/0195876 A1 | 8/2007 | Prodic | |
| 2007/0257653 A1 | 11/2007 | Naka | |
| 2007/0268009 A1 * | 11/2007 | Duan | 323/282 |
| 2007/0285140 A1 | 12/2007 | Kubo | |
| 2008/0010474 A1 * | 1/2008 | Chapuis | 713/300 |

FOREIGN PATENT DOCUMENTS

| | | |
|---|---|---|
| JP | 2001-251370 | 9/2001 |

OTHER PUBLICATIONS

Office Action issued Apr. 18, 2012 in Japanese Application No. 2008-298025 filed Nov. 21, 2008 (w/English translation).

* cited by examiner

FIG. 3A
Output Voltage of A0
FIG. 3B
Output Voltage of A(n+1)/2
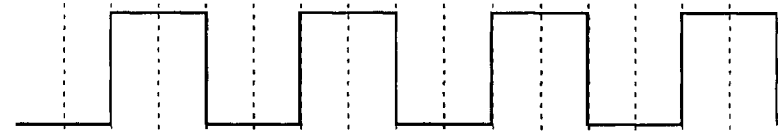
FIG. 3C
clk
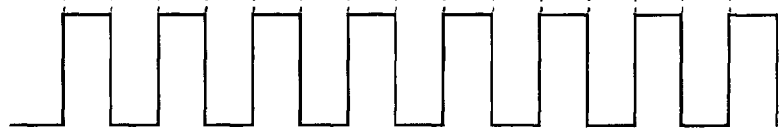
FIG. 4A
clk
FIG. 4B
cnt ⟩⟨000⟩⟨001⟩⟨010⟩⟨011⟩⟨100⟩⟨101⟩⟨110⟩⟨111⟩⟨000⟩⟨001⟩
FIG. 4C
s
FIG. 4D
$q_0$"00"
$q_1$"01"
$q_2$"10"
$q_3$"11"
FIG. 4E
R
FIG. 4F
$V_0$ "err1 err2" = "00"

"err1 err2" = "11"

"err1 err2" = "10"

Current Flowing through Each of Power ICs ($I/N_{op}$) [A]

D1

D2_set

D2_reset

D2

SEMICONDUCTOR DEVICE

CROSS-REFERENCE TO RELATED APPLICATIONS

This application is a division of and claims the benefit of priority under 35 U.S.C. §120 from U.S. Ser. No. 12/986,500 filed Jan. 7, 2011, which is a divisional of U.S. Ser. No. 12/351,426 filed Jan. 9, 2009, and claims the benefit of priority under 35 U.S.C. §119 from Japanese Patent Application No. 2008-117491 filed Apr. 28, 2008, Japanese Patent Application No. 2008-004894 filed Jan. 11, 2008 and Japanese Patent Application No. 2008-298025 filed Nov. 21, 2008; the entire contents of each of which are incorporated herein by reference.

BACKGROUND OF THE INVENTION

This invention relates to a semiconductor device in which a digital control power source is formed.

For example, PWM (Pulse Width Modulation) control in an analog power source is performed by comparison of triangle wave and feedback voltage (for example, Patent document 1 (JP-A 2001-251370 (Kokai)). In this case, a pulse width realized by analog PWM circuit can continuously change.

On the other hand, in a PWM circuit in a digital power source, time can be merely set discretely. When the PWM control is performed by using a clock, the clock of 1 GHz becomes required for realizing a time resolution of 1 nanosecond, and the clock of 10 GHz becomes required for realizing a time resolution of 100 picoseconds. In forming a circuit generating a clock having such a high frequency on a semiconductor substrate, a most-advanced process is required, and there is a problem that the consumption current increases for operation by the clock.

Moreover, conventionally, a plurality of power sources are connected in parallel. For example, when ten power sources having an output current of 10 ampere are operated in parallel, a power source having an output current of 100 ampere can be composed.

A current digital power IC having a parallel running function is "Master Control Architecture" composed of one master IC controlling switching of all of the phases and a plurality of driver ICs. A problem thereof is that the power system becomes failed in itself if a trouble is caused in the master IC from any cause.

Moreover, in Non-patent document 1 ("Current Sharing in Digitally Controlled Masterless Multi-phase DC-DC Converters", Power Electronics Specialists Conference, 2005. PESC '05. IEEE 36th), a masterless architecture in which a plurality of ICs each having capability of becoming the master are connected in parallel to realize parallel running has been disclosed. However, a master clock is input from the outside, and the current information is shared among the power ICs (the phases) through a high-speed digital bath, and therefore, the number of terminals is large and the power consumption is also large.

Moreover, reference voltage used for controlling the output voltage to converge to be a target value is generalized (shared) among the power source ICs. This leads to increase of the number of the terminals in actual productization, and the reference voltage-shared terminals are affected by, wiring resistance on the substrate, parasitic capacitance, and noise, and therefore, it is necessary to care for wiring among the power ICs and the design is troublesome.

Moreover, in the case of multi-phase operation, its interleaving setting is performed by setting outside the power ICs, and if a trouble is caused in any one of the phases from any cause, the power system becomes failed in itself, and therefore, the advantage of the masterless architecture has been lost.

SUMMARY OF THE INVENTION

According to a first aspect of the invention, there is provided a semiconductor device including: a voltage-control-type clock generation circuit having a plurality of stages of first delay elements and whose oscillation frequency is controlled according to a control voltage applied to the first delay elements; a delay circuit having a plurality of stages of second delay elements connected serially; and a selection circuit selecting one from pulse signals output by the plurality of stages of respective second delay elements, the first delay elements and the second delay elements having a same structure formed on a same semiconductor substrate, and a delay amount of the second delay elements being adjusted according to the control voltage.

According to a second aspect of the invention, there is provided a semiconductor device including: a voltage-control-type clock generation circuit having a plurality of stages of first delay elements and whose oscillation frequency is controlled according to a first control voltage applied to the first delay elements; a delay circuit having a plurality of stages of second delay elements connected serially; a selection circuit selecting one from pulse signals output by the plurality of stages of respective second delay elements; an error detection circuit detecting disagreement of a delay amount in the delay circuit; and an error adjustment circuit applying a second control voltage that is the first control voltage compensated based on the detection result of the error detection circuit, the first delay elements and the second delay elements having a same structure formed on a same semiconductor substrate, and a delay amount of the second delay elements being adjusted according to the second control voltage.

According to a third aspect of the invention, there is provided a semiconductor device including a digital PWM circuit outputting: a first pulse signal switching from a low level to a high level at a timing of being synchronized with a clock signal and switching from the high level to the low level at a timing set by a shorter time resolution than that of a period of the clock signal; and a second pulse signal switching from a low level to a high level at a timing set by a shorter time resolution than that of a period of the clock signal and switching from the high level to the low level at a timing set by a shorter time resolution than that of a period of the clock signal, the digital PWM circuit including: a delay circuit having a plurality of stages of delay elements connected serially; a first selection circuit selecting one from outputs of the respective delay elements and outputting a signal setting a falling timing of the first pulse signal; a second selection circuit selecting one from outputs of the respective delay elements and outputting a signal setting a rising timing of the second pulse signal; and a third selection circuit selecting one from outputs of the respective delay elements and outputting a signal setting a falling timing of the second pulse signal.

BRIEF DESCRIPTION OF THE DRAWINGS

FIGS. 3A to 3C are waveform charts of main signals in a voltage-control-type clock generation circuit shown in FIG. 1;

FIGS. 4A to 4F are timing charts of the main signals in the circuit shown in FIG. 1;

FIG. 8A shows the case where the delay amount varies to the direction of becoming slower, FIG. 8B shows the case where the delay amount varies to the direction of becoming smaller, and FIG. 8C shows the case where the delay amount does not vary;

DETAILED DESCRIPTION OF THE INVENTION

Hereinafter, embodiments of this invention will be described with reference to drawings.

First Embodiment

Figure 1:
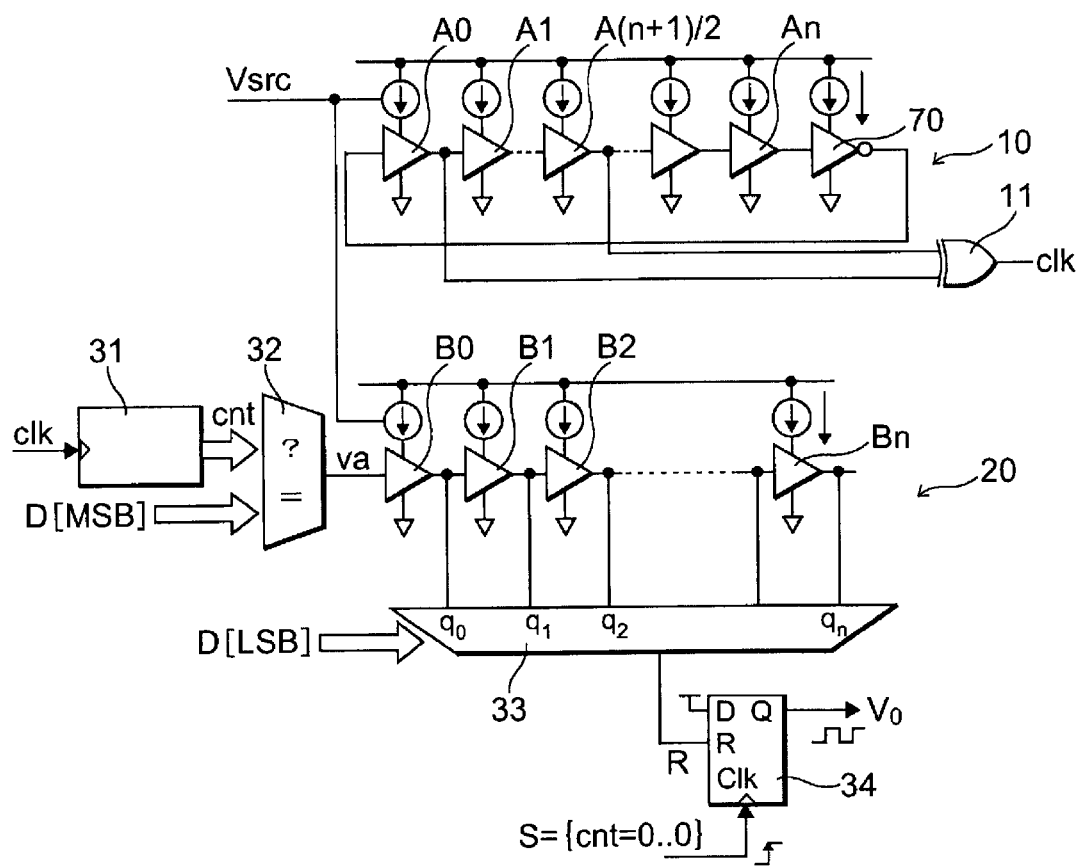
FIG. 1 is a schematic cross-sectional view showing the circuit structure formed in a semiconductor device according to a first embodiment of the invention.

FIG. 1 is a schematic cross-sectional view showing a circuit structure formed in a semiconductor device according to a first embodiment of the invention.

The circuit shown in FIG. 1 is a digital PWM (Pulse Width Modulation) circuit and has a voltage-control-type clock generation circuit 10, a delay circuit 20, a delay element input circuit 32, a counter 31, a multiplexer 33, a flipflop 34, and so forth. These are formed on a common semiconductor substrate and composed as one semiconductor device (chip or packaged shape).

The voltage-control-type clock generation circuit 10 has delay elements A0, A1, A(n+1)/2, ... An (the suffix n is odd number) serving as a plurality of stages of first delay elements. This circuit has a ring oscillator structure in which (n+1) delay elements A0, A1, A(n+1)/2, ... An are cascade-arranged and the output of the last-stage delay element An is input to an inverter circuit 70 and the output of the inverter circuit 70 is input to the first-stage delay element A0.

Figure 2:
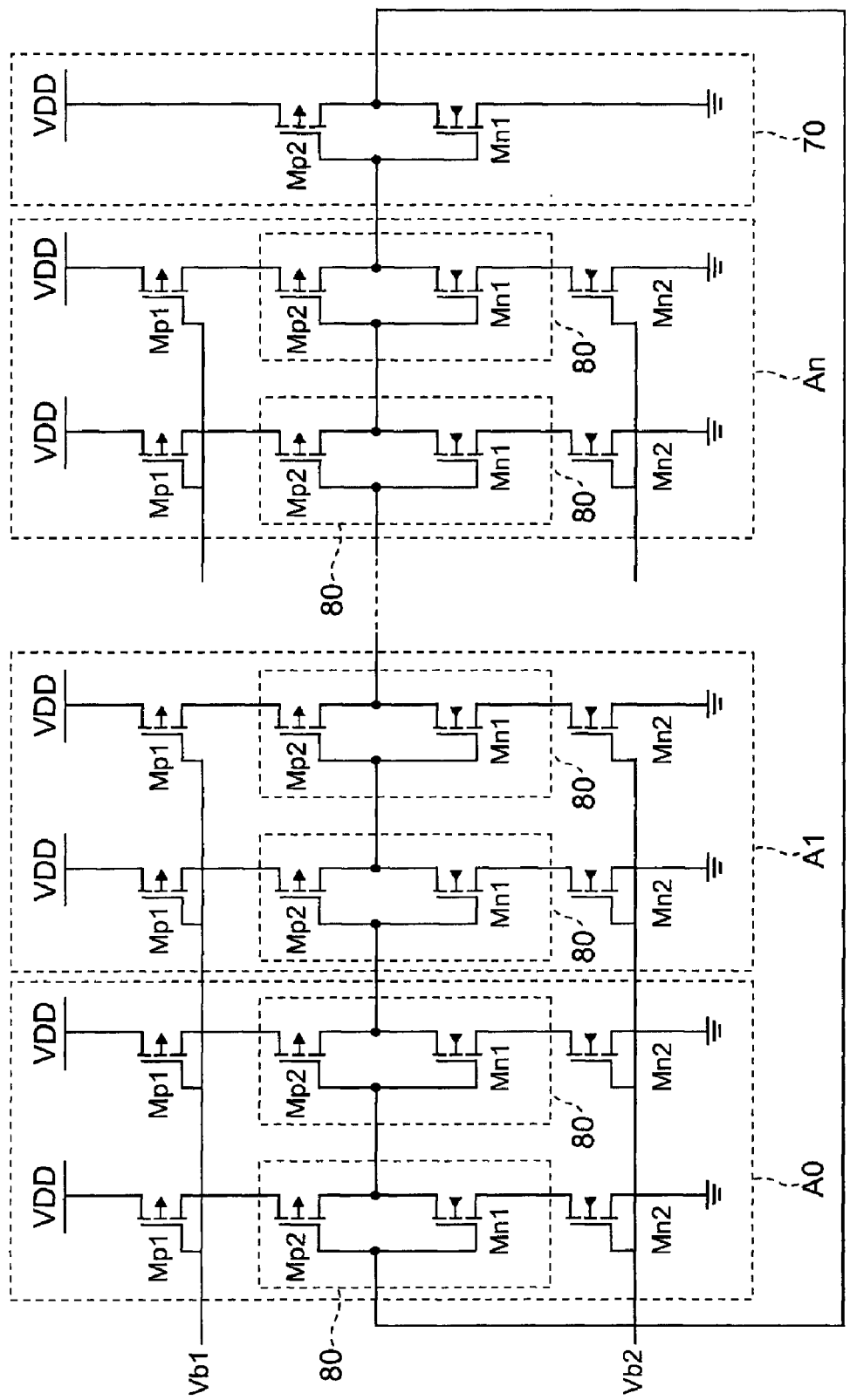
FIG. 2 is a circuit diagram of a first delay element shown in FIG. 1.

An example of the circuit structure of the delay elements A0, A1, A(n+1)/2, ... An and the inverter circuit 70 is shown in FIG. 2.

Each of the delay elements A0, A1, A(n+1)/2, ... An has a structure in which two inverter circuits each composed of a p-type MOS transistor Mp2 and an n-type MOS transistor Mn1 are cascade-arranged. The gates of the transistor Mp2 and the transistor Mn1 are connected to each other, and the drain in which the transistors Mp2, Mn1 are connected to each other serves as the output terminal, and this output terminal is connected to the gate in which the next-stage transistors Mp2, Mn1 are connected to each other.

Furthermore, a p-type MOS transistor Mp1 serving as a transistor controlling the operation current is connected between a power wire of a power voltage VDD and the transistor Mp2, and an n-type MOS transistor Mn2 is connected between the transistor Mn1 and a ground node. The operation current of the transistor Mp1 is controlled by a bias voltage Vb1. The operation current of the transistor Mn2 is controlled by a bias voltage Vb2. The inverter 80 being capable of controlling the operation current outputs a value inverted to the input. Therefore, in order to output the delayed signal without inverting the signal in each of the delay elements A0, A1, A(n+1)/2, two inverter circuits 80 are cascade-arranged.

The inverter circuit 70 connected to the output terminal of the last-stage delay element An has only one structure that is the same as the inverter 80 composed of the p-type MOS transistor Mp2 and the n-type MOS transistor Mn1. In order that the ring oscillator oscillates, it is necessary that the stage number of the inverter circuits 80 is odd. Accordingly, by inputting the output of the last-stage delay element An to the inverter circuit 70 and inputting the output of the inverter circuit 70 to the first-stage delay element A0, the stage number is set to be odd.

By referring to FIG. 1 again, the output of the first-stage delay element A0 (shown in FIG. 3(a)) and the output of the delay element A(n+1)/2 (shown in FIG. 3(b)) are input to an exclusive disjunction or EXOR (EXclusive OR) circuit 11, and the EXOR circuit 11 output a clock signal clk shown in FIG. 3(c). Thereby, the clock generation circuit 10 can output a signal clk having a frequency that is two-times larger than a frequency oscillated by the plurality of delay elements A0, A1, A(n+1)/2, ..., An and the inverter circuit 70.

In the present embodiment, the clock signal clk is generated by using the EXOR circuit 11, but another circuit except for the EXOR circuit is possible as long as outputting the frequency that is two-times larger than the frequency oscillated by the plurality of delay elements A0, A1, A(n+1)/2, ... An, and the inverter circuit 70.

The frequency clock signal clk depends on the delay amount (delay time) of each of the delay elements A0, A1, A(n+1)/2, ... An, and the delay amount depends on the current flowing through each of the delay elements A0, A1, A(n+1)/2, ... An. And, the current flowing each of the delay elements A0, A1, A(n+1)/2, ... An is controlled by the control voltage Vsrc. That is, in the voltage-control-type clock generation circuit 10, the oscillation frequency is controlled according to the applied control voltage Vsrc.

The delay circuit 20 also has delay elements B0, B1, B2, ... Bn (the suffix n is odd) serving as a plurality of stages of second delay elements that are cascade-arranged in the same manner as the clock generation circuit 10, and the delay elements B0, B1, B2, ... Bn are connected not in a ring shape but linearly. That is, the output of the last-stage delay element Bn is not returned to the input side of the first-stage delay element B0.

The delay elements B0, B1, B2, ... Bn in the delay circuit 20 have the same circuit structure as the delay elements A0, A1, A(n+1)/2, ... An in the clock generation circuit 10 so as to be synchronized with the clock frequency (frequency of the clock signal clk). That is, the delay elements A0, A1, A(n+1)/2, ... An, and the delay elements B0, B1, B2, ... Bn in the delay circuit 20 are the delay elements having the same structures formed on the same semiconductor substrate (semiconductor chip), and each of the delay elements B0, B1, B2, ... Bn also have the same circuit structures as the delay elements A0, A1, A(n+1)/2, ... An described above with reference to FIG. 2.

And, the current flowing through each of the delay elements B0, B1, B2, ... Bn is controlled by the same control voltage Vsrc as applied to the clock generation circuit 10, and therefore, the delay amount of each of the delay elements B0, B1, B2, ... Bn is adjusted by the control voltage Vsrc.

In the former stage of the delay circuit 20, the delay element input circuit 32 is provided, and to the delay element input circuit 32, a count value cnt of the counter 31 and, for example, a digital signal D [MSB] with top 3 bits of a 5-bit digital signal are input.

Here, FIG. 4 is a timing chart of the main signals clk, cnt, S, q0, q1, q2, q3, R, and V0 in the circuits of FIG. 1.

The counter 31 counts up the clock signals clk oscillated by the clock generation circuit 10 one by one (by one period) as shown in FIG. 4(b), and when the counted value (3 bits) cnt accords to D[MSB], the delay element input circuit 32 outputs a pulse signal va to the first-stage delay element B0. The pulse signal va is a pulse signal having a width of one period of the clock signal clk.

The example shown in FIG. 4 indicates the case of "011", and the pulse signal va is input to the first-stage delay element B0 at the timing that the count value cnt becomes "011", and the pulse signal va transmits through each of the delay elements B0, B1, B2, ... Bn sequentially from the first stage, and delay according to the control voltage Vsrc is generated as shown in FIG. 4(d) in the timing that each of the pulse signals q0, q1, q2, q3, ... output by the respective delay elements B0, B1, B2, ... Bn rises.

Each of the output q0, q1, q2, ... of the respective delay elements B0, B1, B2, ... Bn is input, for example, to the multiplexer 33 as a selection circuit. The multiplexer 33 selects one of the output q0, q1, q2, ... of the respective delay elements B0, B1, B2, ... Bn on the basis of D[LSB] with low 2 bits in the 5-bit digital signal whose top 3 bits are used as the above-described D[MSB], and the selected output is output to the reset terminal of the flipflop 34 as the reset pulse R as shown in FIG. 4(e). The example shown in FIG. 4 indicates the case that the D[LSB] has "10", and the output q2 is selected, and the reset pulse R synchronized with the q2 is output to the reset terminal of the flipflop 34.

To the set terminal of the flipflop 34, the set pulse S shown in FIG. 4(c) is input. The set pulse S has a predetermined period, and becomes ON, for example, when the count value cnt of the counter 31 is "000".

The flipflop 34 outputs a pulse signal V0 from the output terminal. As shown in FIG. 4(f), the pulse signal V0 switches from a low level to a high level at the rising edge of the set pulse S, and the high level is held until the reset pulse R is input, and when the reset pulse R is input, the high level switches to the low level at the rising of the reset pulse R.

This pulse signal V0 becomes an output of the PWM circuit shown in FIG. 1, and the pulse signal V0 is provided to the gate of the switching element (MOSFET), ON/OFF of the switching element is controlled.

According to this embodiment, based on the above-described set pulse S and the reset pulse R, PWM control of the pulse signal V0 is performed. The set pulse S rises based on the count value cnt of counting up the clock signal clk one by one (period by period), and by rising of the set pulse S, the pulse signal V0 becomes in the high level from the low level. Therefore, the rising edge of the pulse V0 is relatively roughly determined according to what number of the clock clk the edge is in.

By contrast, the falling edge of the pulse signal V0 is determined by a rising edge of any one of the outputs q0, q1, q2, q3, ... of the respective delay elements B0, B1, B2, ... Bn. Each of the rising edge of q0, q1, q2, q3, ... is delayed with respect to the former stage by smaller time interval than one period of the clock clk, and therefore, a pulse width modulation of the pulse signal V0 is realized by smaller time resolution than one period of the clock clk according to which (rising edge of) signal is selected out of q0, q1, q2, q3, .... Thereby, without requiring high-speed clock, the pulse width modulation can be realized by smaller time resolution, and increase of const or consumption current can be suppressed.

The delay elements A0, A1, A2, ... An of the clock generation circuit 10 and the delay elements B0, B1, B2, B3, ... Bn of the delay circuit 20 are composed by the same circuits formed on the same semiconductor substrate, and the delay amounts thereof are controlled by the same control voltage Vsrc, and therefore, resolution of accurately dividing the clock period can be simply obtained. In the circuit structure of FIG. 1, one clock period can be divided into about (n+1). For example, in the case of dividing it into 32, n=31 is set, and the clock signal clk is generated by the output of the delay element A0 and the output of the delay element A16. As the clock period becomes longer, the transmission delay in the delay circuit 20 becomes larger, and conversely, if the clock period becomes shorter, the transmission delay in the delay circuit 20 becomes shorter.

Second Embodiment

Figure 5:
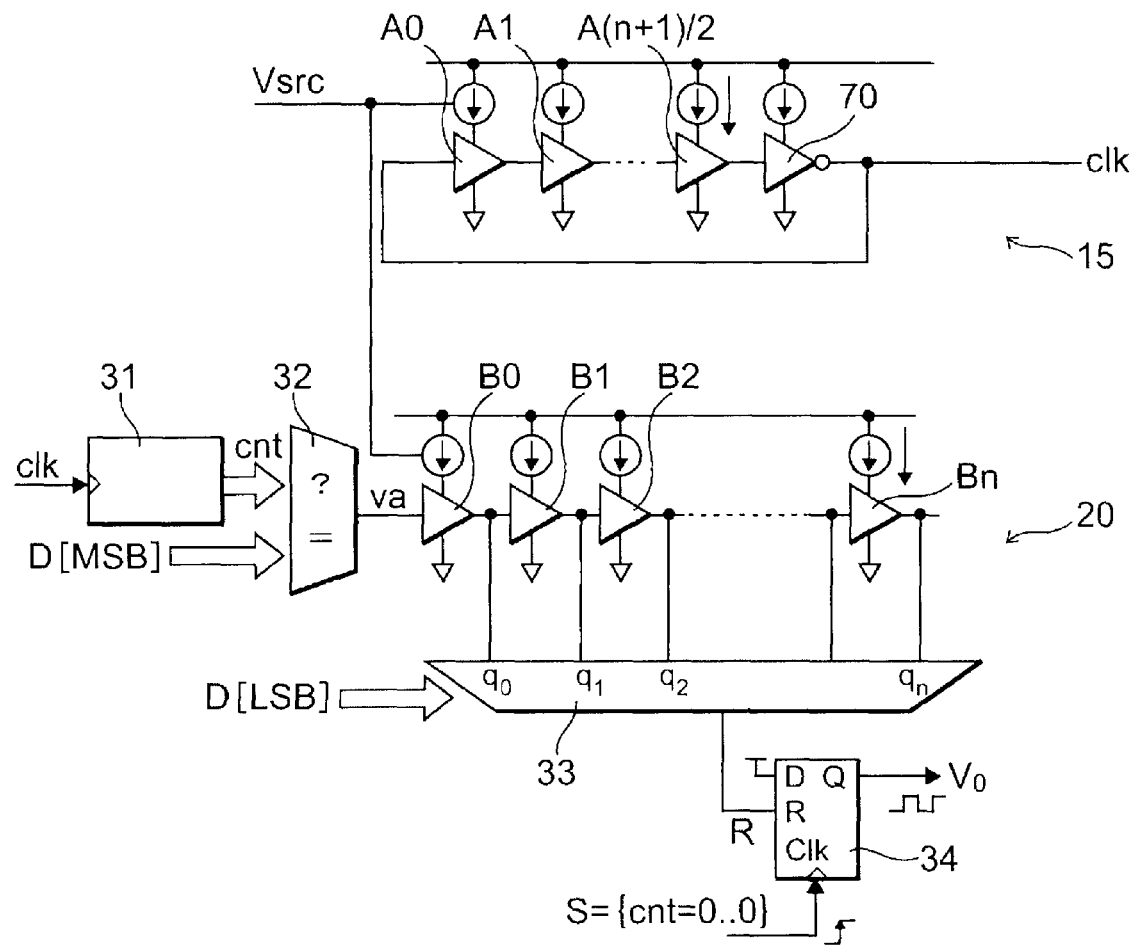
FIG. 5 is a schematic view showing the circuit structure formed in a semiconductor device according to a second embodiment of this invention.

FIG. 5 is a schematic view showing a circuit structure formed in a semiconductor device according to a second embodiment of the invention. The same signs are appended to the same components as the above-described first embodiment, and the detailed explanation thereof will be omitted.

In the second embodiment, the structure of the clock generation circuit is different from that of the first embodiment. The clock generation circuit 15 in the second embodiment is formed by the delay elements A0, A1, ... A(n+1)/2 that are half of those of the clock generation circuit 10 and the inverter circuit 70, and the clock signal clk is output from the output terminal of the inverter circuit 70. Moreover, the EXOR circuit is used in generating the clock signal clk in the first embodiment, but is not required in the second embodiment. Thereby, in this embodiment, the number of the delay elements of the clock generation circuit 15 decreases, and thereby, the occupied area in the semiconductor chip can be reduced compared to the first embodiment.

Third Embodiment

Figure 6:
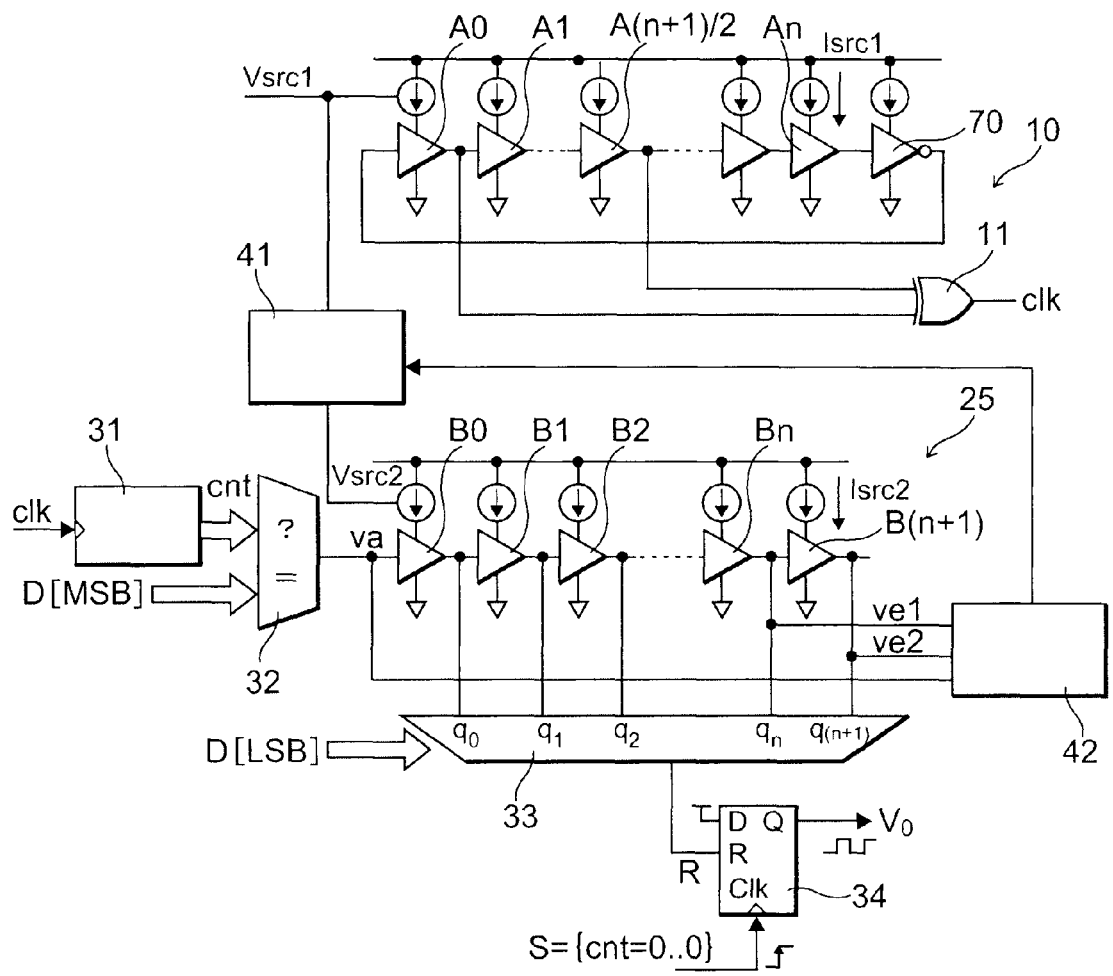
FIG. 6 is a schematic view showing the circuit structure formed on a semiconductor device according to a third embodiment of the invention.

FIG. 6 is a schematic view showing a circuit structure formed on a semiconductor device according to a third embodiment of the invention. The same signs are appended to the same components as the above-described first embodiment, and the detailed explanation will be omitted.

Each of the clock generation circuit 10 and the delay circuit 25 have the delay elements formed on the same semiconductor substrate by the same process, and the same control voltage Vsrc is applied thereto, and therefore, in principle, by the rising edges of the outputs q0, q1, q2, ... in the delay circuit 25, one period of the clock clk is almost accurately evenly divided (delay amount per stage becomes 1/(number of the stages) of the clock period), but if the pair properties of the delay elements in both of the circuits 10, 25 are broken, the rising edges of the outputs q0, q1, q2, ... come not to accurately evenly divide the clock period, and disagreement of the delay amount such as progress or lag of the delay occasionally caused.

Accordingly, in this embodiment, in addition of the above-described structure of the first embodiment, an error detection circuit 42 and an error adjustment circuit 41 are provided as shown in FIG. 6. Moreover, in this embodiment, a delay element B(n+1) is further additionally connected to a latter stage of the last-stage delay element Bn. The delay element B(n+1) is also formed on the same semiconductor substrate and has the same circuit structure, as the delay elements B0, B1, ... Bn.

The error detection circuit 42 detects disagreement of the delay amount in the delay circuit 25 on the basis of, a signal va input to the first-stage delay element B0, an output signal vet of the delay element B(n+1) that is a latter stage of the last stage, and an output signal ve1 of the last-stage delay element Bn.

In this embodiment, in order to perform the control so that the rising edge of the output signal ve1 of the last-stage delay element Bn is contained accurately in one clock period, the delay element B(n+1) is further added at the latter stage of the last-stage delay element Bn.

If the rising edge of the output signal ve1 of the last-stage delay element Bn is not accurately contained in one clock period, the following thing is generated.

The case of linearly inputting a command increasing a value "1" by "1" is thought. The value D[MSB] is fixed and D[LSB] increases "1" by "1", and the nodes are selected sequentially so as to monotonously increase like q0, q1, ... qn. When the node of qn is output, ideally, the delay time becomes equal to one clock period. Then, in D[LSB], "+1" is added to the value of D[MSB]. In this case, in the circuit, the external one clock period+the delay time of the delay element B0 are output. In this case, if the output of the node of qn becomes longer than one clock period, subsequently, the time output by one clock period+delay element B0 occasionally becomes short according to the delay amount of the delay element B0 despite increasing the value, there is possibility that the linearity is broken and that the control is largely affected. Accordingly, in this embodiment, in order to perform the control so that the rising edge of the output signal ve1 of the last-stage delay element Bn is contained accurately in one clock period, the delay element B(n+1) is further added.

Figure 7:
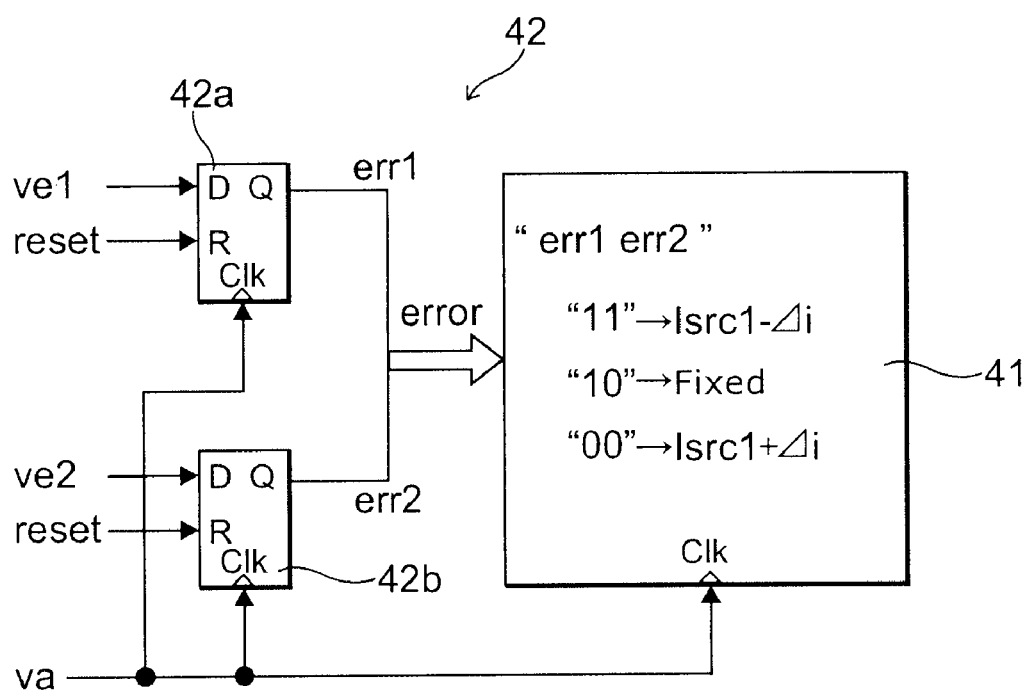
FIG. 7 is a schematic view showing the structure of an error detection circuit in FIG. 6.

The structure of the error detection circuit 42 is shown in FIG. 7.

The output signal ve1 of the last-stage delay element Bn is input to the input terminal of the flipflop 42a, and the output signal ve2 of the delay element B(n+1) of the latter stage of the last stage is input to the input terminal of the flipflop 42b. And, the input signal va to the first-stage delay element B0 is input to each of the flipflops 42a, 42b at the rising edge as a set pulse.

The signal va is a pulse having a width of one period of the clock clk, and as shown in FIG. 8, by the falling edge of the pulse va, each of the output signal ve1 of the last-stage delay element Bn and the output signal ve2 of the delay element B(n+1) that is the latter stage of the last stage is latched.

Figure 8A:
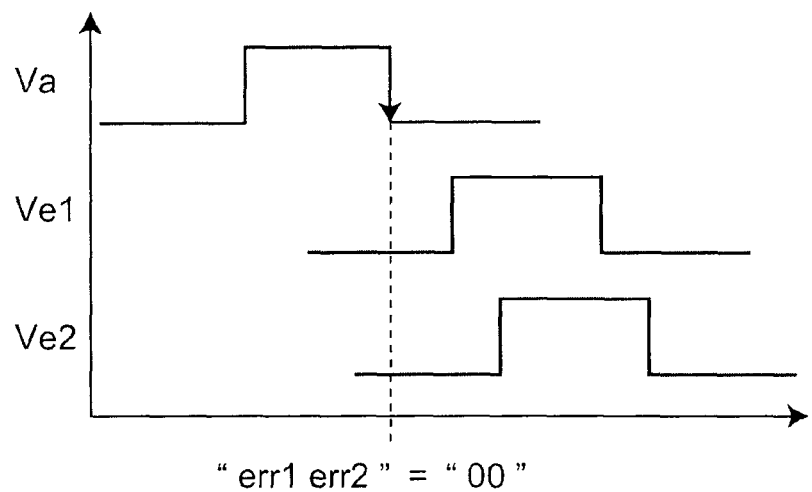
FIGS. 8A to 8C are timing charts for each signal va, ve1, ve2 shown in FIG. 6.

When the delay amount varies to the direction of becoming slower, both of ve1, ve2 are latched to the low level by the falling edge of the signal va as shown in FIG. 8A, and the value of "00" is output to the error adjustment circuit 41. In this case, the error adjustment circuit 41 increases the current flowing through the delay elements B0, B1, ... B(n+1). That is, when the current flowing through the delay elements A0, A1, A(n+1)/2, ... An of the clock generation circuit 10 is Isrc1 and the current Isrc2 flowing through the delay elements B0, B1, ... B(n+1) of the delay circuit 20 is Isrc2, Isrc2 is increased more than Isrc1 (Isrc2=Isrc1+Δi). Because the operation current increases, the delay elements B0, B1, ... B(n+1) operates at a higher speed than the case of adding Δi. Accordingly, feedback is generated to the direction of making the delay amount smaller.

Figure 8B:
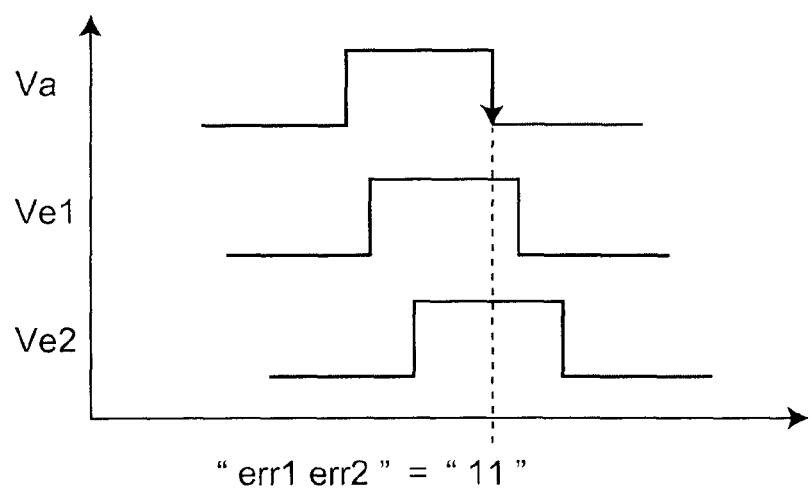

By contrast, when the delay amount varies to the direction of becoming smaller, both of ve1, ve2 are latched to the high level by the falling edge of the signal va as shown in FIG. 8B, and the value of "11" is output to the error adjustment circuit 41. In this case, the error adjustment circuit 41 decreases Isrc2 more than Isrc1 (Isrc2=Isrc1−Δi). Because the operation current decreases, the delay elements B0, B1, ... B(n+1) operates at a lower speed than the case of reducing Δi. Accordingly, feedback is generated to the direction of making the delay amount larger.

Figure 8C:
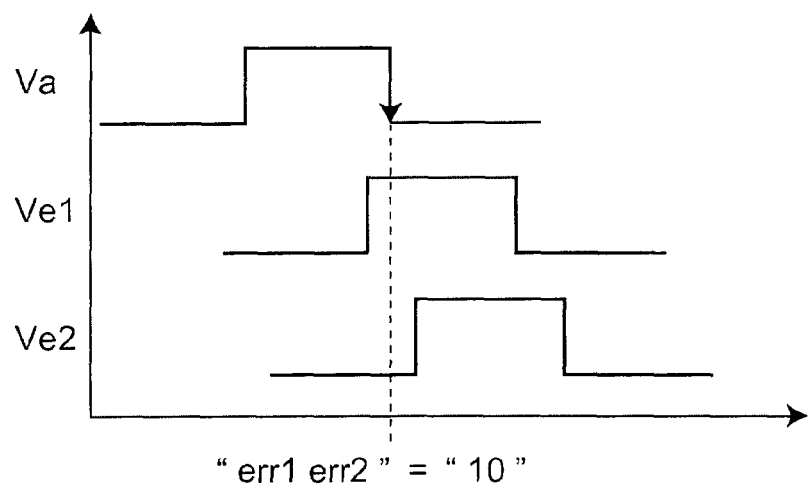

When ve1 is latched to the high level and ve2 is latched to the low level at the falling edge of the signal va as shown in FIG. 8C, the delay amount is determined not to have disagreement, the value of "10" is output to the error adjustment circuit 41. In this case, the error adjustment circuit 41 does not increase and decrease Isrc2, but the current Isrc2 is held.

When the detection result by the error detection circuit 42 is "00" or "11", the error adjustment circuit 41 adjusts Isrc2 so that "00" or "11" becomes "10". That is, the error adjustment circuit 41 applies the second control voltage Vsrc2 that is the compensated first control voltage Vsrc1 applied for flowing the current Isrc1 through the delay elements A0, A1, A(n+1)/2, ... An, to the delay circuit 25, and thereby, the current Isrc2 flows through the delay elements B0, B1, ... B(n+1) of the delay circuit 25 by the second control voltage Vsrc2.

Figure 9:
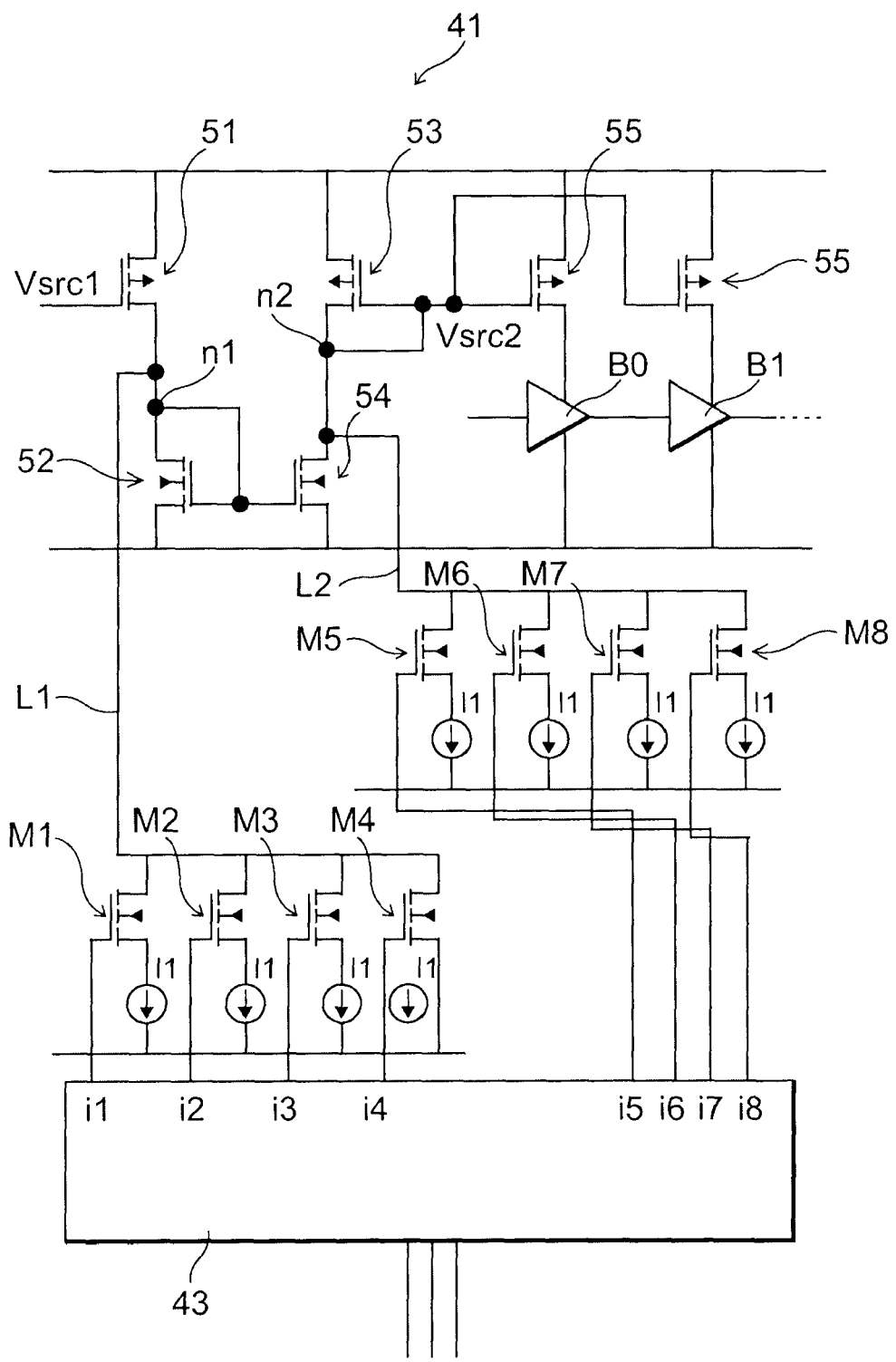
FIG. 9 is a schematic view showing the structure of an error adjustment circuit in FIG. 6.

One example of the circuit structure of the error adjustment circuit 41 is shown in FIG. 9.

The error adjustment circuit 41 has a decoder 43, for example eight switching elements (N-type MOS) M1 to M8 ON/OFF-controlled with receiving the signal from the decoder 43 to the gates thereof, and a current mirror circuit composed of P-type MOSs 51, 53 and N-type MOSs 52, 54.

In the initial state, all of the output ports i1 to i8 of the decoder 43 output "0", and all of the eight switching elements M1 to M8 are set to be in the OFF state, and accordingly, the current does not flow through the lines L1 and L2. In this case, P-type MOS 51 is set to be in the ON state by the first control voltage Vsrc1 applied to the gate thereof, and thereby the same current flows through the nodes n1, n2. The bias voltage corresponding to this current is applied to the gate of the P-type MOS 55 corresponding to each of the delay elements B0, B1, B2, ... B(n+1), and the P-type MOS 55 becomes in the ON state, and the current is supplied to each of the delay elements B0, B1, B2, ... B(n+1).

When the detection result in the above-described error detection circuit 42 is "00", first, "1" is output only from the port i5 (the other ports i1 to i4 and i6 to i8 remain "0"). When the port i5 becomes "1", the switching element M5 becomes ON, the current flows through the line L2. When the current flowing through the line L2 is I1 and the current flowing through the node n2 in the above-described initial state is I, the current of I+I1 flows through the node n2. And, the gate of the P-type MOS 55 is biased according to the current of I+I1, and as a result, a larger current than that of the initial state flows through each of the delay elements B0, B1, B2, ... B(n+1), and the delay amount is compensated to the direction of becoming smaller.

After the compensation, if the detection result in the error detection circuit 42 still remains "00", "1" is also output from the port i6 in addition of the port i5. When the ports i5 and i6 become "1", the switching elements M5 and M6 become ON, the current two-times larger than I1 flows through the line L2. Accordingly, the current of I+(2×I1) flows through the node n2, and the gate of the P-type MOS 55 is biased according to the current of I+(2×I1), and the current flowing through each of the delay elements B0, B1, B2, ... B(n+1) is adjusted to be larger, and the delay amount is compensated to the direction of becoming smaller.

When the detection result in the error detection circuit 42 becomes "10", the above-described current adjustment in the error adjustment circuit 41 is finished, but if the detection result in the error detection circuit 42 still indicates "00", by sequentially setting the ports i7, i8 to be "1", the current flowing through each of the delay elements B0, B1, B2, ... B(n+1) is adjusted so as to be larger.

When the detection result in the above-described error detection circuit 42 is "11", first, "1" is output only from the port i1 (the other ports i2 to i4 and i5 to i8 remain "0"). When the port i1 becomes "1", the switching element M1 becomes ON, the current flows through the line L1. When the current flowing through the line L1 is I1 and the current flowing through the node n1 in the above-described initial state is I, the current of I−I1 flows through the node n1. And, the gate of the P-type MOS 55 is biased according to the current of I−I1, and as a result, a smaller current than that of the initial state flows through each of the delay elements B0, B1, B2, ... B(n+1), and the delay amount is compensated to the direction of becoming slower.

After the compensation, if the detection result in the error detection circuit 42 still remains "11", "1" is also output from the port i2 in addition of the port i1. When the ports i1 and i2 become "1", the switching elements M1 and M2 become ON, the current two-times larger than I1 flows through the line L1. Accordingly, the current of I−(2×I1) flows through the node n1, and the gate of the P-type MOS 55 is biased according to the current of I−(2×I1), and the current flowing through each of the delay elements B0, B1, B2, ... B(n+1) is adjusted to be smaller, and the delay amount is compensated to the direction of becoming slower.

When the detection result in the error detection circuit 42 becomes "10", the above-described current adjustment in the error adjustment circuit 41 is finished, but if the detection result in the error detection circuit 42 still indicates "11", by sequentially setting the ports i3, i4 to be "1", the current flowing through each of the delay elements B0, B1, B2, ... B(n+1) is adjusted so as to be smaller.

As described above, by adjusting the current flowing through each of the delay elements B0, B1, B2, ... B(n+1) on the basis of the detected disagreement of the delay amount to compensate the disagreement of the delay amount, it can be realized that one period of the clock clk is almost accurately evenly divided by rising edges of the outputs q0, q1, q2, ... (delay amount per stage becomes 1/(number of the stages) of the clock period). As a result, the precise and reliability of the PWM control can be improved.

In the above-described specific example, four-stage adjustment can be performed for both of the directions of making the delay smaller and slower, but here, the assumed disagreement of the delay amount is only based on variation of the semiconductor process, and considering the current semiconductor process, the disagreement of the delay amount cannot be thought to be too large, and the disagreement can be sufficiently addressed by the adjustment widths of several stages (several bits) as shown in FIG. 9, and thereby, cost up beyond necessity can be suppressed.

Fourth Embodiment

Figure 10:
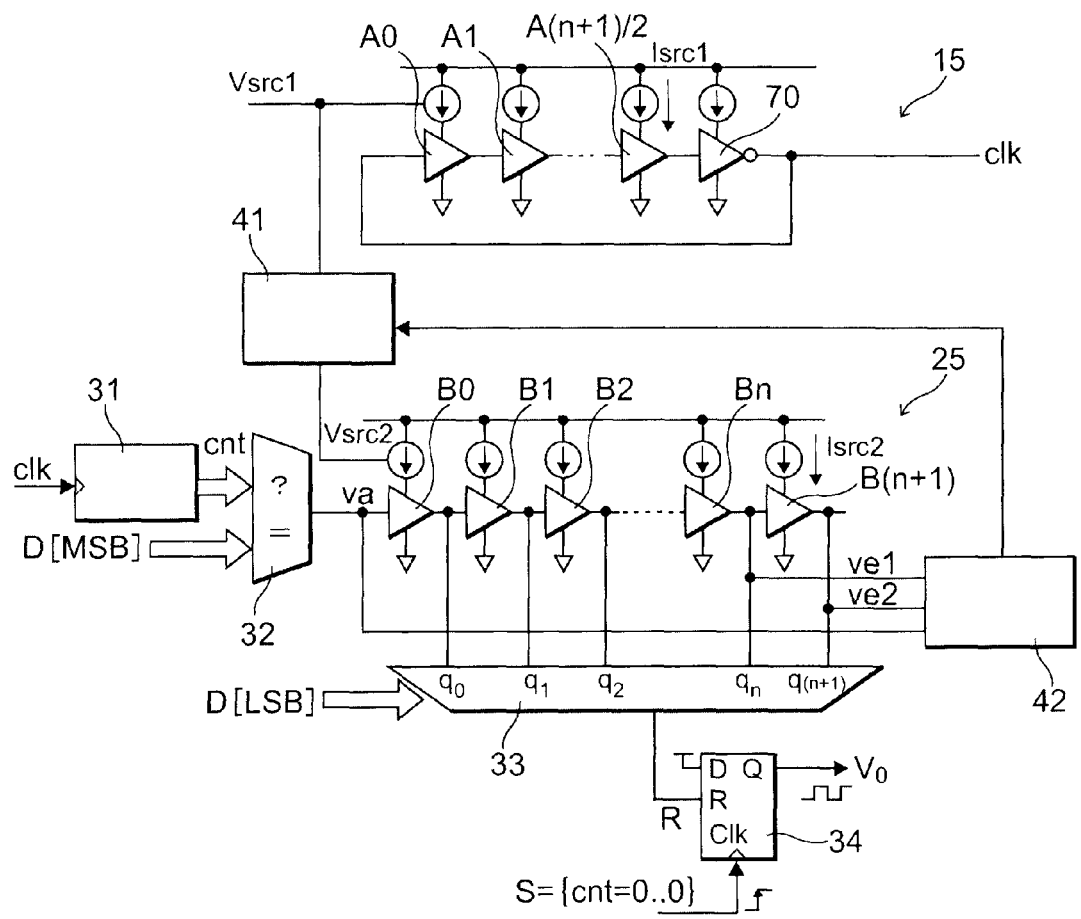
FIG. 10 is a schematic view showing the circuit structure formed on a semiconductor device according to a fourth embodiment of the invention.

FIG. 10 is a schematic view showing a circuit structure formed on a semiconductor device according to a fourth embodiment of the invention. The same signs are appended to the same components as the above-described embodiments, and the detailed explanation will be omitted.

In the fourth embodiment, the structure of the clock generation circuit is different from that of the third embodiment. The clock generation circuit 15 in the fourth embodiment is formed by the delay elements A0, A1, ... A(n+1)/2 that are half of those of the clock generation circuit 10 in the third embodiment and the inverter circuit 70, and the clock signal clk is output from the output terminal of the inverter circuit 70. Moreover, the EXOR circuit 11 is used in generating the clock signal clk in the third embodiment, but is not required in the fourth embodiment. Thereby, in this embodiment, the number of the delay elements of the clock generation circuit 15 decreases, and thereby, the occupied area in the semiconductor chip can be reduced compared to the third embodiment.

Figure 11:
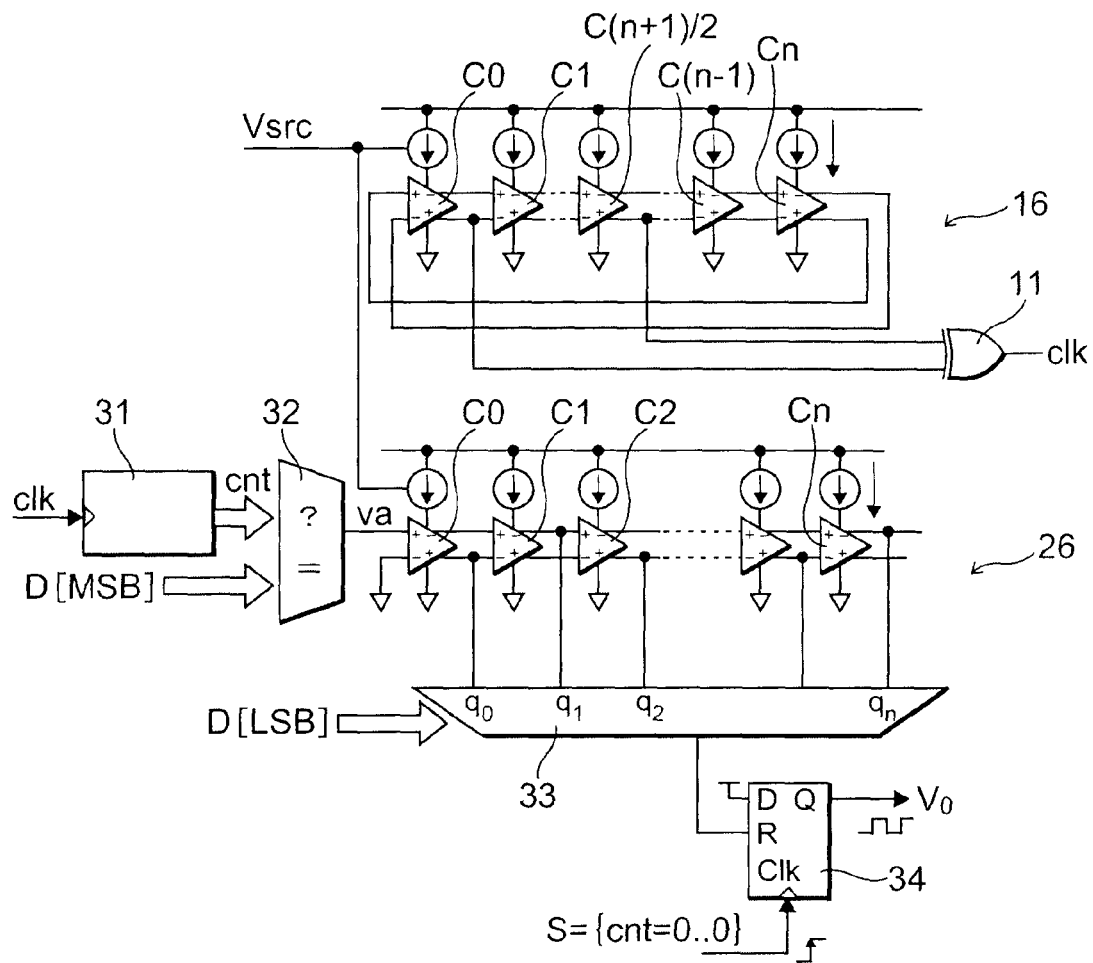
FIG. 11 is a schematic view showing the structure of the semiconductor device according to this embodiment of the invention based on a completely differential circuit as the delay element.
Figure 12:
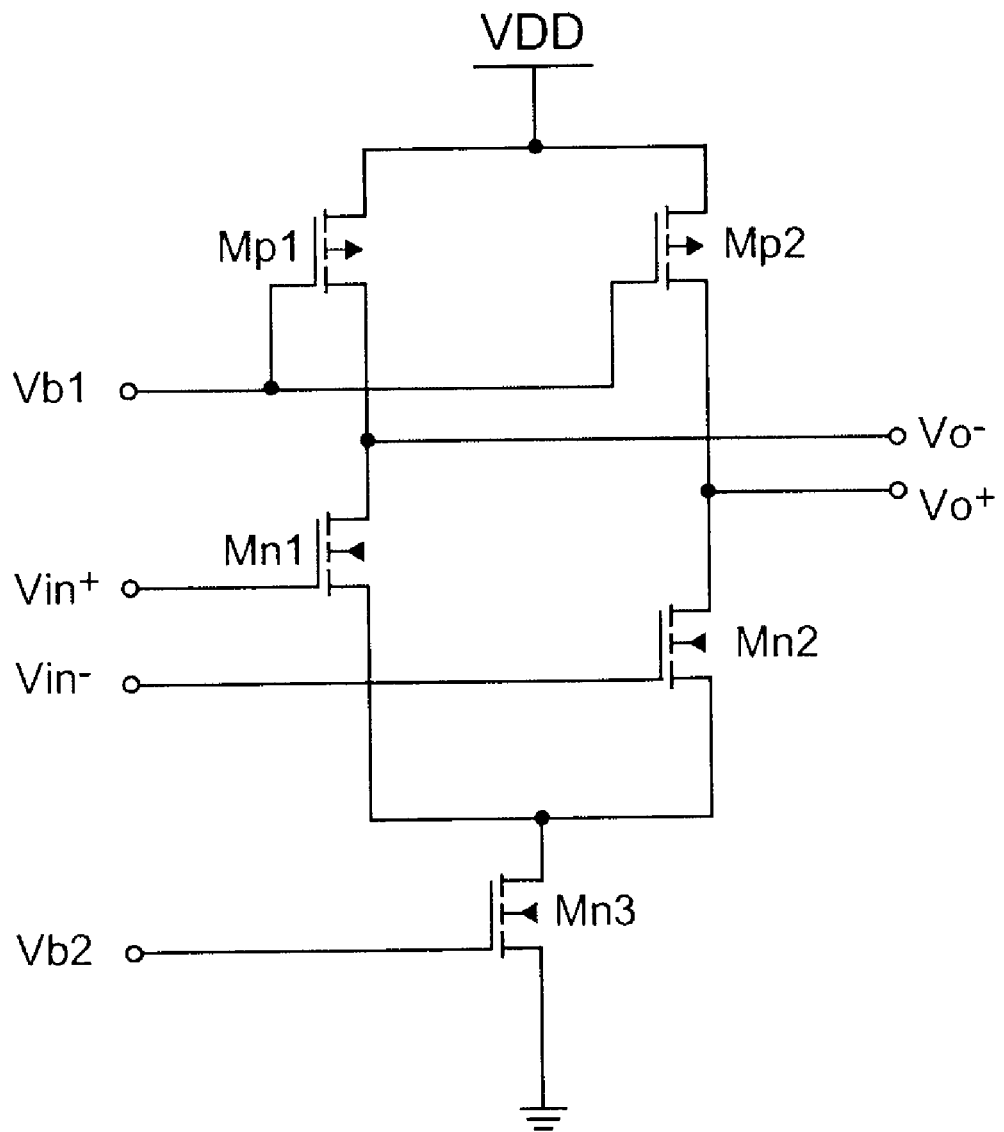
FIG. 12 is a circuit diagram of the delay element shown in FIG. 11.

In the above-described embodiments, one-input-and-one-output circuit is used as the delay element, but, a completely differential circuit may be used as shown in FIGS. 11, 12.

In FIG. 11, the clock generation circuit 16 has (n+1) delay elements C0, C1, ... Cn. In the above-described embodiments, the inverter circuit 70 is connected to the latter stage of the last-stage delay element, and by contrast, in the structure shown in FIG. 11, without using the inverter 70, the ring oscillator structure is formed by (n+1) delay elements C0, C1, ... Cn.

In each of the first-stage C0 to (n−1) stage in the delay elements, (+) output terminal is connected to (−) input terminal of the next stage, and (−) output terminal is connected to (+) input terminal of the next stage, but for generating oscillation, the (+) output terminal of the last-stage Cn is connected to (+) input terminal of the first-stage C0, and the (−) output terminal thereof is connected to (−) input terminal of the first-stage C0.

The delay circuit 26 also has (n+1) delay elements C0, C1, ... Cn cascade-arranged in the same manner as the clock generation circuit 16, but the delay elements C0, C1, ... Cn are connected not in a ring shape but linearly.

The delay elements C0, C1, ... Cn in the delay circuit 26 have the same circuit structures as the delay elements C0, C1, ... Cn of the clock generation circuit 16 so as to being synchronized with the clock period in the clock generation circuit 16. That is, the delay elements of the clock generation circuit 16 and the delay elements of the delay circuits 26 are the same structures formed on the same semiconductor substrate (semiconductor chip). And, the current flowing through each of the delay elements C0, C1, ... Cn in the delay circuit 26 is controlled by the same control voltage Vsrc as applied to the clock generation circuit 16, and the delay amount is adjusted.

The flipflop 34 operates by detecting the rising edge of a pulse, and therefore, it is necessary that the delay circuit 26 also alternately outputs "+" and "−" as the two outputs of each of the delay elements C0, C1, ... Cn so that the rising edge is output.

One example of the circuit structure of each of C0, C1, ... Cn composed as the completely differential circuit is shown in FIG. 12.

The p-type transistors Mp1, Mp2 have the common gate and the common source potential (power voltage VDD) and connected respectively to drains of n-type MOS transistors Mn1, Mn2. Moreover, the sources of the n-type MOS transistors Mn1, Mn2 are connected to the drain of n-type MOS transistor Mn3.

The gate of the transistor Mn1 functions as (+) input terminal, and the gate of the transistor Mn2 functions as (−) input terminal. The drains of the transistor Mp1 and the transistor Mn1 are connected to each other to be (−) output terminal. The drains of the transistor Mp2 and the transistor Mn2 are connected to each other to be (+) output terminal.

By controlling the gate potential Vb1 of the transistors Mp1, Mp2 and the gate potential Vp2 of the transistor Mn3, the operation current of this current can be adjusted, and the delay time can be controlled.

With referring to FIG. 11 again, the (+) terminal output of the first-stage delay element C0 and the (+) terminal output of the delay element C(n+1)/2 are input to the EXOR circuit 11, and the EXOR circuit 11 outputs the clock signal clk.

Because one clock period is determined by the delay time of (n+1) delay elements and the delay time of the inverter circuit 70, one clock period cannot be accurately divided into 1/(n+1) by the influence of the delay time of the inverter circuit 70, and by contrast, in the structure of FIG. 11, the oscillation is performed by (n+1) delay elements C0, C1, ... Cn, and therefore, one period can be accurately divided to 1/(n+1).

Figure 13:
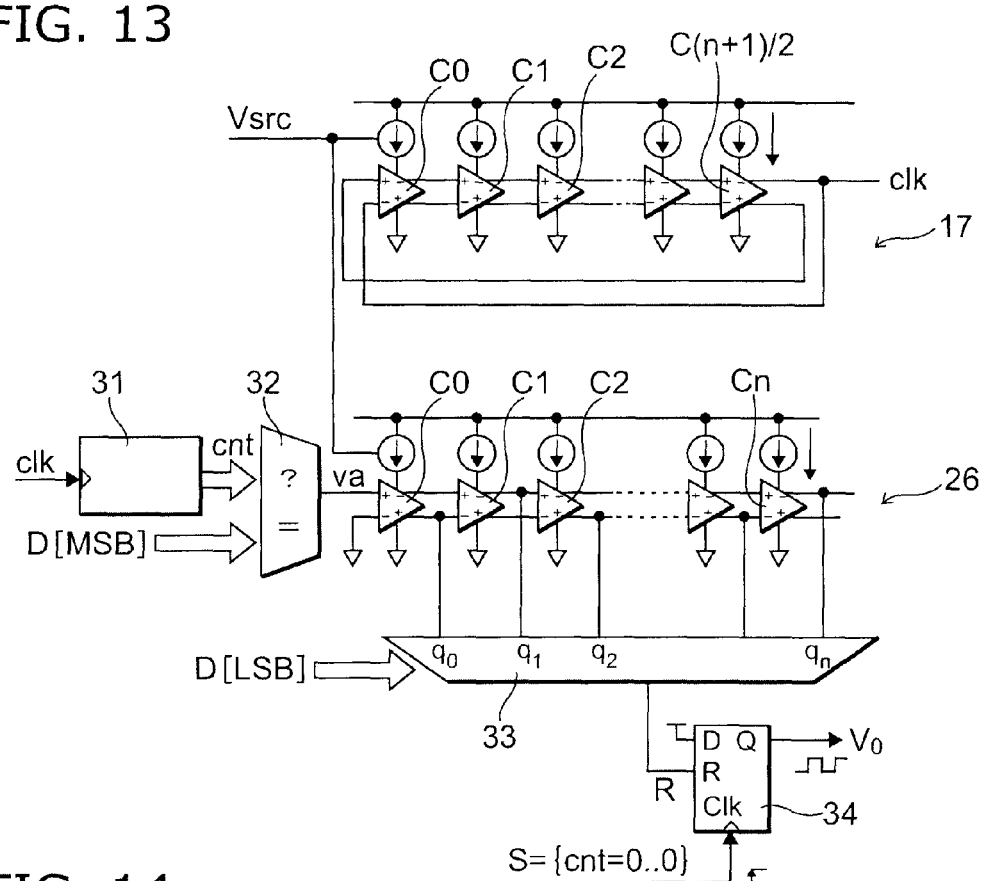
FIG. 13 is a schematic view showing a modification example without using EXOR circuit in the clock generation circuit shown in FIG. 11.

Moreover, in the structure of FIG. 11, it is also possible that without using EXOR circuit 11, the clock generation circuit is composed only by C(n+1)/2 delay elements C0, C1, ... C(n+1)/2 as shown in FIG. 13. In the clock generation circuit 17, by decreasing the number of the delay elements to be half in comparison to the clock generation circuit shown in FIG. 11, the occupied area in the semiconductor chip can be reduced.

The application example of the digital PWM circuit of each of the above-described embodiments includes a digital control power source. Hereinafter, a DC-DC converter will be exemplified as the digital control power source.

Figure 14:
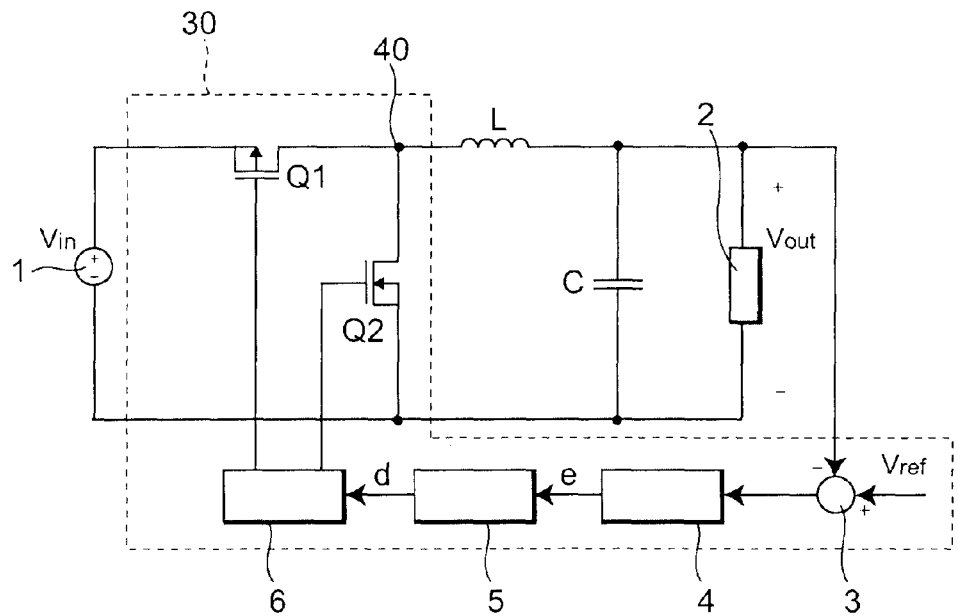
FIG. 14 is a schematic view showing the structure of a voltage step down DC-DC converter as one example of a digital control power source according to this embodiment of the invention.

FIG. 14 is a schematic view showing a structure example of the DC-DC converter, and the DC-DC converter has switching elements Q1, Q2, an inductor L, a condenser C, a control circuit switching ON/OFF of the switching elements Q1, Q2, and so forth.

The DC-DC converter is a voltage step down DC-DC converter (buck converter) for obtaining (average) output voltage Vout lower than the input voltage Vin by alternately switching ON/OFF of the high-side switching element Q1 and the low-side switching element Q2.

The elements (a comparator 3, an A/D conversion circuit 4, a PID (proportional-integral-derivative) compensator 5, a digital PWM circuit 6, and the switching elements Q1, Q2) surrounded by dashed line in FIG. 14 are composed as IC30 that is one chip (or one package).

Each of the switching elements Q1, Q2 is, for example, power MOSFET (Metal-Oxide-Semiconductor Field Effect Transistor), and each of the gate terminals is connected to the digital PWM circuit 6.

The source-drain of the high-side switching element Q1 is connected between the input voltage source 1 and the switch node 40, and the source-drain of the low-side switching element Q2 is connected between the switch node 40 and the ground. The switch node 40 that is a connective point of both of the switching elements Q1, Q2 is connected to a load 2 through the inductor L. Moreover, as a filter element for not largely changing the output voltage in a short time, a condenser C is connected between the output side of the inductor L and the ground.

For controlling ON/OFF of the switching elements Q1, Q2, the switching pulse having an almost inverted phase is provided from the digital PWM circuit 6 to the gate of each of the switching elements Q1, Q2.

When the high-side switching element Q1 is ON and the low-side switching element Q2 is OFF, the current flows from the input voltage source 1 through the switching element Q1 to the inductor L, and the inductor current increases, and energy is accumulated in the inductor L. And, when the high-side switching element Q1 is OFF and the low-side switching element Q2 is ON, the inductor L releases the accumulated energy, and a return current flowing from the ground through the switching element Q2 to inductor L flows (the inductor current comes to decrease).

The output voltage Vout is controlled so as to converge to a target output voltage (reference voltage Vref). Specifically, the output voltage Vout is input to the comparator 3, and the comparator 3 outputs the comparison result of the output voltage Vout and the reference voltage Vref to the A/D conversion circuit 4, and the A/D conversion circuit 4 outputs an error signal e indicating how much the actual output voltage disagrees with the target output voltage, as a digital signal to the compensator 5. By receiving this error signal e, the compensator 5 calculates duty of ON/OFF of the switching elements Q1, Q2 and output the duty as a duty command value d to the digital PWM circuit 6.

Moreover, when both of the switching elements Q1, Q2 are simultaneously set to be in the ON state, very large current (pass-through current) comes to flow through both of the switching elements Q1, Q2 to the ground. For avoiding this, in setting the duty of ON/OFF of the switching elements Q1, Q2, the dead time that is a period in which both of the switching elements Q1, Q2 are OFF is set.

Hereinafter, with reference to FIGS. 15 to 20 and 38 to 40, specific examples of the digital PWM circuit will be explained. Each of the digital PWM circuits 81 to 87 shown as follows corresponds to the digital PWM circuit 6 shown in FIG. 14.

Fifth Embodiment

Figure 15:
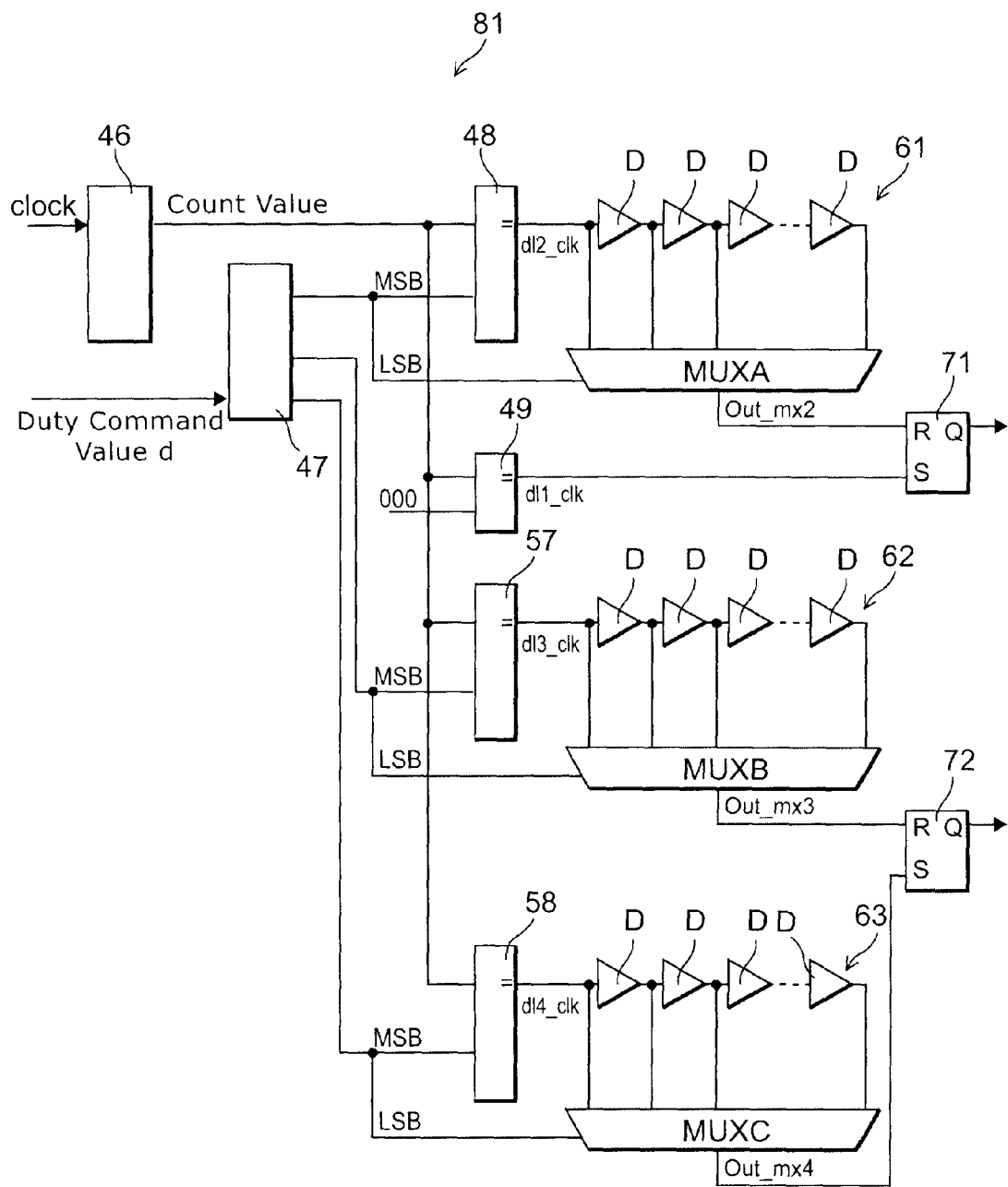
FIG. 15 is a circuit diagram showing one structure example of a digital PWM circuit shown in FIG. 14 as a semiconductor device according to a fifth embodiment of the invention.

FIG. 15 is a schematic view illustrating a structure of a digital PWM circuit 81 according to a fifth embodiment of the invention.

The digital PWM circuit 81 generates gate control signals according to the duty command value d transmitted from the compensator 5. The gate control signals Out_mx2 and dl1_clk operate flipflop 71 and generate gate signals for switching ON/OFF of the high-side switching element Q1. The gate control signals Out_mx3 and Out_mx4 operate the flipflop 72 and generate gate signals for switching ON/OFF of the switching element Q2.

Moreover, the digital PWM circuit 81 further has a clock generation circuit, which is not shown. This clock generation circuit has a ring oscillator structure in which a plurality of delay elements are cascaded-arranged in a ring shape in the same manner as above-described embodiments, and the digital PWM circuit 81 operates with being synchronized with the clock signal (clock) generated by the clock generation circuit. Moreover, the delay elements in the clock generation circuit and the delay elements D of each of the delay circuits 61 to 63 shown in FIG. 15 are formed to have the same structures on the same semiconductor substrate.

Figure 16:
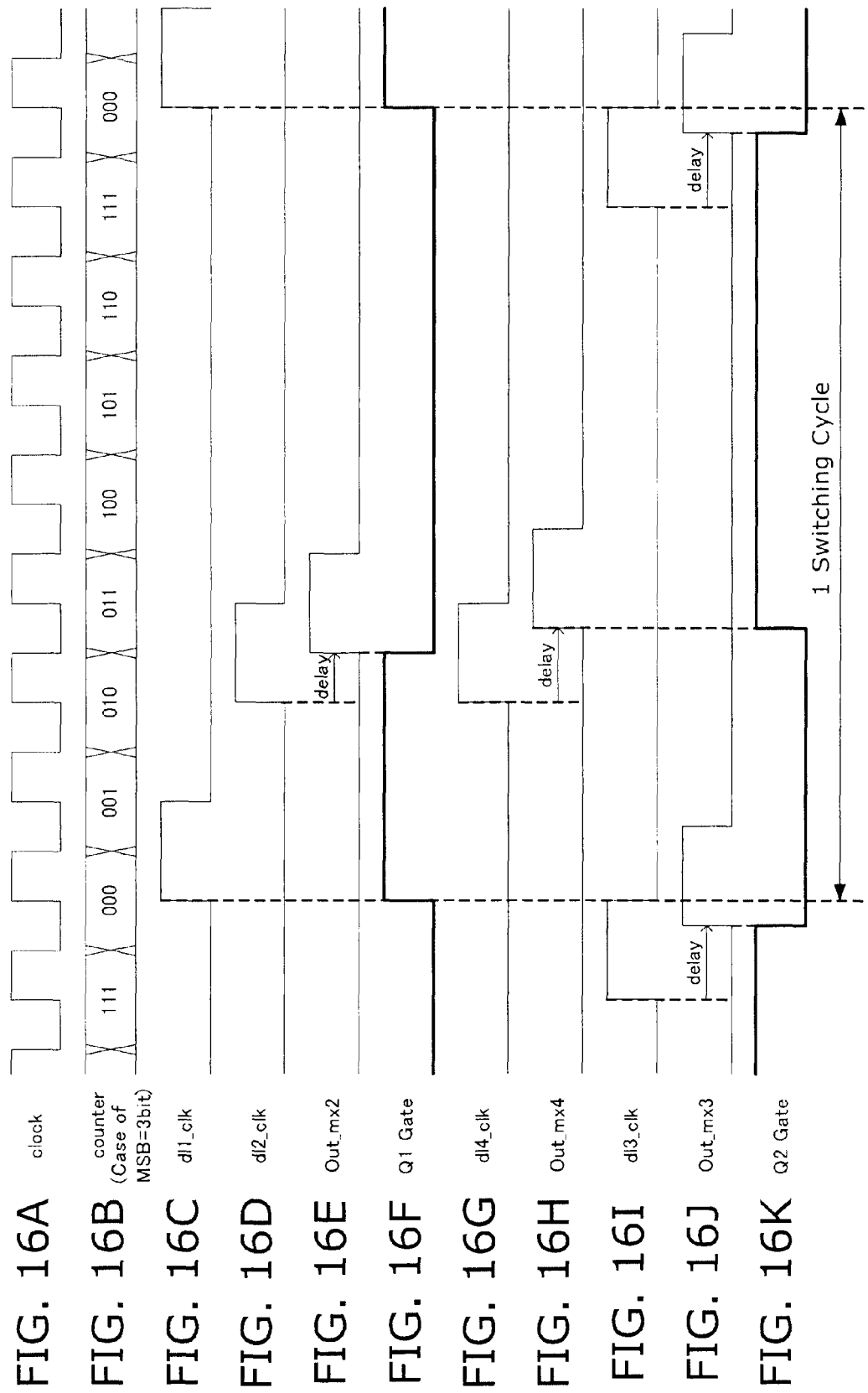
FIGS. 16A to 16K are waveform charts (timing charts) of the main signals in the circuit shown in FIG. 15.

FIG. 16 is a timing chart of main signals in the digital PWM circuit 81.

The counter 46 counts clock (FIG. 16(a)) generated by the clock generation circuit one by one (period by period) as shown in FIG. 16(b), and supplies the clock to each of the comparators 48, 49, 57, 58, for example, as the 3-bit count values.

Upper several bits (MSB) out of the duty command value (digital signal) d calculated in the compensator 5 shown in FIG. 14 are supplied to the comparators 48, 57, 58 through the input resistor 47. Lower several bits (LSB) out of the duty command value d are supplied through the input resistor 47 to multiplexers MUXA, MUXB, and MUXC that are selection circuits for plural inputs and one output.

The comparator 48 outputs the signal dl2_clk (FIG. 16(d)) having a pulse width of one clock period to the delay circuit 61 at the timing that the count value agrees with MSB. This signal dl2_clk transmits through each of the delay elements D sequentially from the first stage, and delay is generated in the rising timing of the output signal of each of the delay elements D.

The output signal of each of the delay elements D is input to the multiplexer MUXA. The multiplexer MUXA selects one (FIG. 16(e)) of output signals of the respective delay elements on the basis of the signal LSB and outputs the one to the reset terminal R of the flipflop 71.

The comparator 49 outputs the signal dl1_clk (FIG. 16(c)) having a pulse width of one clock period to the set terminal S of the flipflop 71 at the timing that the count value agree with, for example, "000".

The flipflop 71 outputs the pulse signal shown in FIG. 16(f) from the output terminal Q. This output signal switches from the low level to the high level at the timing that the signal dl1_clk (FIG. 16(c)) input to the set terminal S switches from the low level to the high level, and the high level is held while the output signal Out_mx2 (FIG. 16(e)) of the multiplexer MUXA input to the reset terminal R is in the low level, and the high level switches to the low level at the timing that the signal Out_mx2 input to the reset terminal R switches from the low level to the high level. The output signal (FIG. 16(f)) of the flipflop 71 is supplied to control terminal (gate) of the high-side switching element Q1, and based thereon, ON/OFF of the switching element Q1 is switched.

That is, the rising timing of the switching pulse for switching ON/OFF of the high-side switching element Q1 is set at the timing of being synchronized with clock signal (clock), and the falling timing is set by the smaller time resolution than that of the clock signal (clock) by utilizing a signal delay in the delay circuit 61.

For the switching pulse for switching ON/OFF of the low-side switching element Q2, both of rising and falling timings are set by smaller time resolution than that of the clock signal (clock) by using the delay circuits 62, 63 in order to enhance precision of the above-described dead time adjustment.

That is, the comparator 57 outputs the signal dl3_clk (FIG. 16(*i*)) having a pulse width of one clock period to the delay circuit 62 at the timing that the count value agrees with MSB. This signal dl3_clk transmits through each of the delay elements D sequentially from the first stage, and delay is generated in the rising timing of the output signal of each of the delay elements D.

The output signal of each of the delay elements D in the delay circuit 62 is input to the multiplexer MUXB. The multiplexer MUXB selects one (FIG. 16(*j*)) of output signals of the respective delay elements on the basis of the signal LSB and outputs the one to the reset terminal R of the flipflop 72.

The comparator 58 outputs the signal dl4_clk (FIG. 16(*g*)) having a pulse width of one clock period to the delay circuit 63 at the timing that the count value agrees with MSB. This signal dl4_clk transmits through each of the delay elements D sequentially from the first stage, and delay is generated in the rising timing of the output signal of each of the delay elements D.

The output signal of each of the delay elements D in the delay circuit 63 is input to the multiplexer MUXC. The multiplexer MUXC selects one (FIG. 16(*h*)) of output signals of the respective delay elements D on the basis of the signal LSB and outputs the one to the set terminal S of the flipflop 72.

The flipflop 72 outputs the pulse signal shown in FIG. 16(*k*) from the output terminal Q. This output signal switches from the low level to the high level at the timing that the output signal out_mx4 (FIG. 16(*h*)) of the multiplexer MUXC input to the set terminal S switches from the low level to the high level, and the high level is held while the output signal Out_mx3 (FIG. 16(*j*)) of the multiplexer MUXB input to the reset terminal R is in the low level, and the high level switches to the low level at the timing that the signal Out_mx3 input to the reset terminal R switches from the low level to the high level. The output signal (FIG. 16(*k*)) of the flipflop 72 is supplied to control terminal (gate) of the low-side switching element Q2, and based thereon, ON/OFF of the switching element Q2 is switched.

Sixth Embodiment

Figure 17:
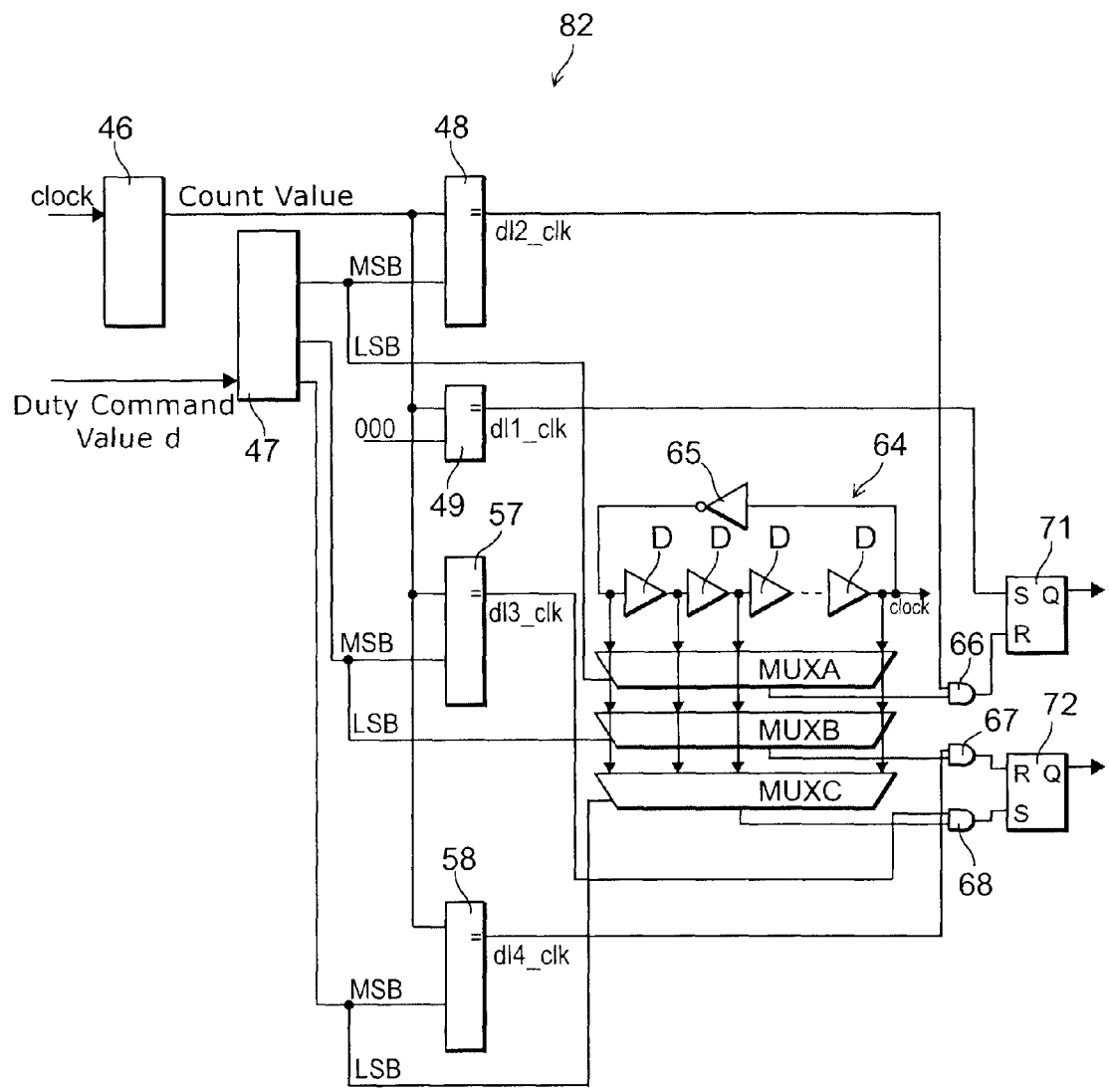
FIG. 17 is a circuit diagram showing another structure example of the digital PWM circuit shown in FIG. 14 as a semiconductor device according to a sixth embodiment of the invention.

FIG. 17 is a schematic view illustrating a structure of a digital PWM circuit 82 according to a sixth embodiment of the invention. The same signs are appended to the same components as the components shown in FIG. 15.

In this embodiment, the functions of the clock generation circuit and three delay circuits 61 to 63 in the above-described circuit shown in FIG. 15 is consolidated to one. That is, the delay circuit 64 also has a function of generating the clock signal (clock).

The delay circuit 64 has a plurality of cascade-arranged delay elements D and an inverter circuit 65, and has a ring oscillator structure in which the output of the last-stage delay element D is input to the inverter circuit 65 and the output of the inverter 65 is input to the first-stage delay element D.

Moreover, in this embodiment, an AND gate 66 having the output of comparator 48 and the output of the multiplexer MUXA as two inputs, an AND gate 67 having the output of comparator 58 and the output of the multiplexer MUXB as two inputs, and an AND gate 68 having the output of comparator 57 and the output of the multiplexer MUXC as two inputs, are provided. The output of the AND gate 66 is input to the reset terminal R of the flipflop 71, and the output of the AND gate 67 is input to the reset terminal R of the flipflop 72, and the output of the AND gate 68 is input to the set terminal S of the flipflop 72.

The functions as the entire digital PWM circuit are the same as the circuit shown in FIG. 15, but in this embodiment, when the count value input to the comparator 48 agrees with MSB, the output of the corresponding multiplexer MUXA is set to be effective, and when the count value input to the comparator 58 agrees with MSB, the output of the corresponding multiplexer MUXB is set to be effective, and when the count value input to the comparator 57 agrees with MSB, the output of the corresponding multiplexer MUXC is set to be effective.

That is, at the timing that both of two inputs of AND gate 66 become in the high level, the reset signal is transmitted to the reset terminal R of the flipflop 71, and the output of the flipflop 71 switches from the high level to the low level. Moreover, at the timing that both of two inputs of AND gate 68 become in the high level, the set signal is transmitted to the set terminal S of the flipflop 72, and the output of the flipflop 72 rises from the low level to the high level, and at the timing that both of two inputs of AND gate 67 become in the high level, the reset signal is transmitted to the reset terminal R of the flipflop 72, and the output of the flipflop 72 switches from the high level to the low level.

As described above, also in this embodiment, the rising timing of the switching pulse for switching ON/OFF of the high-side switching element Q1 is set at the timing of being synchronized with the clock signal (clock), and the falling timing thereof is set by the smaller time resolution than that of the clock signal (clock), and for the switching pulse for switching ON/OFF of the low-side switching element Q2, both of the rising and falling timings are set by the smaller time resolution than that of the clock signal (clock).

For the above-described delay circuits (delay lines) 61, 62, 63 in the embodiment shown in FIG. 15, it is required that each of the entire delay amounts thereof is equal to one period of the clock signal (clock) and that the delay amounts of the respective delay elements D are equal. Currently, it is difficult to satisfy this, and in the structure of FIG. 15, the area occupied in one chip tends to be large.

By contrast, in the embodiment shown in FIG. 17, the functions corresponding to the clock generator and the delay circuits 61 to 63 are consolidated to one circuit 64, and thereby, the entire delay amount can be precisely set to be one clock period, and the semiconductor device can be composed by the small number of elements, and therefore, variation of the delay amounts of the respective delay elements is also suppressed, and the occupied area of the delay elements is also reduced. That is, in this embodiment, by simplifying the structure, the improvement of the characteristics and reduction of the area can be achieved.

Seventh Embodiment

Figure 18:
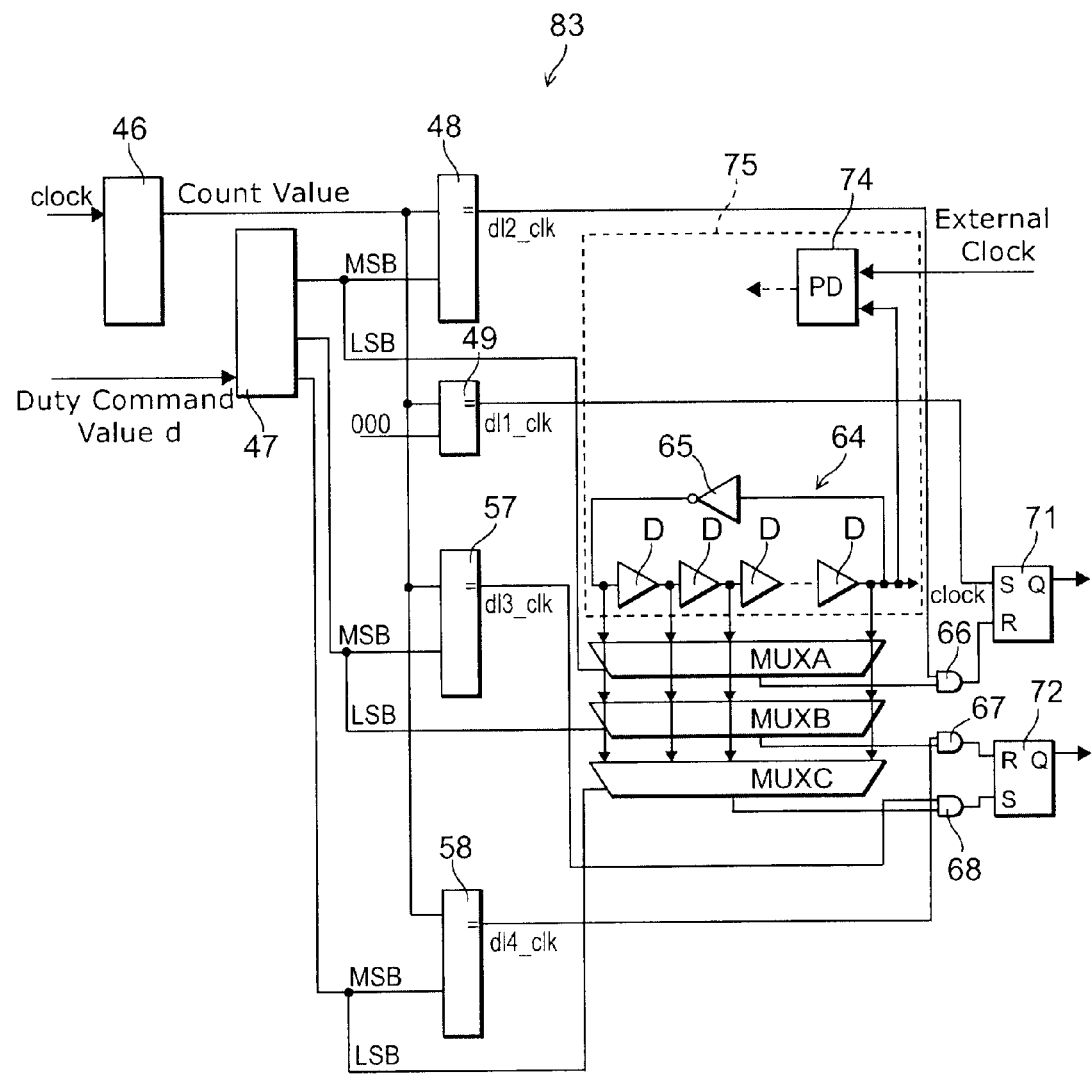
FIG. 18 is a circuit diagram showing still another structure example of the digital PWM circuit shown in FIG. 14 as a semiconductor device according to a seventh embodiment of the invention.

FIG. 18 is a schematic view illustrating a structure of a digital PWM circuit 83 according to a seventh embodiment of the invention. The same signs are appended to the same components as the components shown in FIG. 17.

In this embodiment, the delay circuit 64 is incorporated as one component of DLL (Delay Locked Loop) or PLL (Phase Locked Loop). In this DLL/PLL 75, the PD (Phase Detector) 74 detects the phase difference between the external clock and the internal clock (clock) generated by the delay circuit 64 and feedbacks the phase difference to the delay circuit 64 and synchronizes the internal clock (clock) with the external clock, and thereby, the phase (frequency) of the internal clock (clock) can be maintained to be constant without depending on change of treatment, voltage, temperature, or the like. The system of the DC-DC converter is operated with being synchronized with the internal clock (clock), and thereby, characteristic improvement of the entire system can be achieved.

Eighth Embodiment

Figure 19:
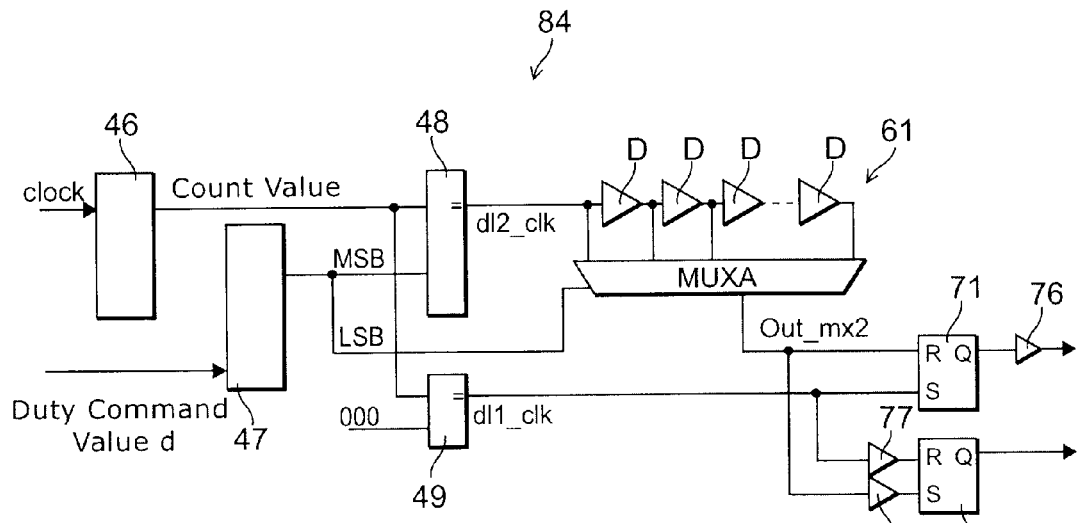
FIG. 19 is a circuit diagram showing still another structure example of the digital PWM circuit shown in FIG. 14 as a semiconductor device according to an eighth embodiment of the invention.
Figure 37:
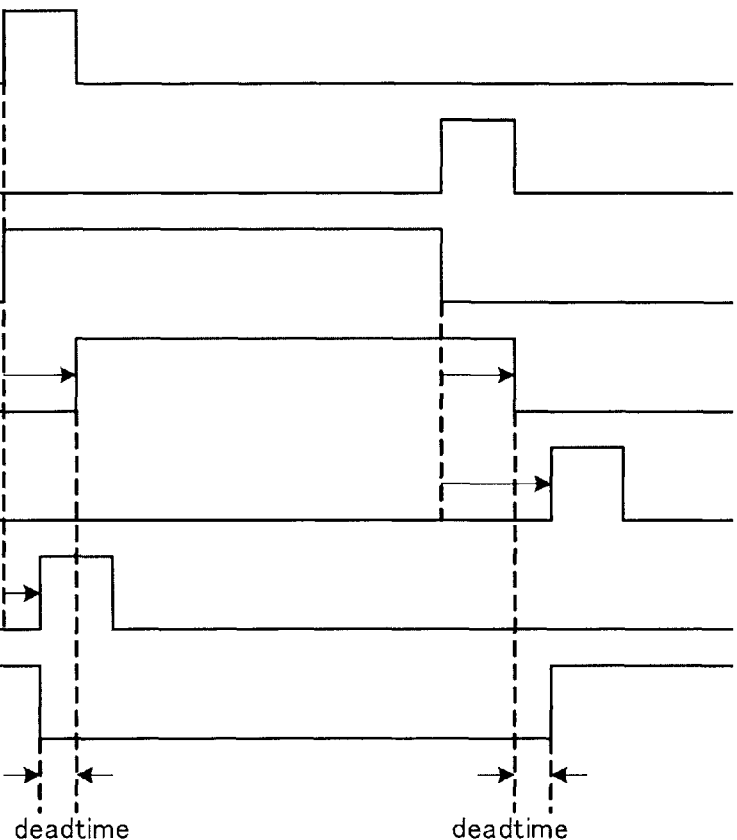
FIGS. 37A to 37G are waveform charts (timing chart) of the main signals in the circuit of FIG. 19.

FIG. 19 is a schematic view illustrating a structure of a digital PWM circuit 84 according to an eighth embodiment of the invention. The same signs are appended to the same components as the above-described embodiment. Moreover, FIG. 37 is a timing chart of main signals in the digital PWM circuit 84.

In the same manner as the above-described embodiments, to the reset terminal R of the flipflop 71 outputting the high-side switching pulse, an output signal Out_mx2 (FIG. 37(b)) of the multiplexer MUXA is input, and to the set terminal S thereof, the output signal dl1_clk (FIG. 37(a)) of the comparator 49 is input.

To the set terminal S of the flipflop 72 outputting a low-side switching pulse, the signal (FIG. 37(e)) delaying the signal Out_mx2 by the delay element 78 is input, and to the reset terminal R thereof, the signal (FIG. 37(f)) delaying the signal dl1_clk by the delay element 77 is input. The delay amounts of the delay element 77 and the delay element 78 can be adjusted.

Moreover, the output signal (FIG. 37(c)) of the high-side flipflop 71 is delayed by the delay element 76 (FIG. 37(d)).

In this embodiment, only one delay circuit 61 determining the time resolution of the digital PWM is used, and the dead time is produced by utilizing signal delay by the delay elements 76 to 78 provided separately from the delay circuit 61. Specifically, by the difference between the delay amount of the delay element 76 and the delay amount of the delay element 77, the low-side switching element Q2 becomes OFF, and the dead time is generated until the high-side switching element Q1 becomes ON, and by the difference between the delay amount of the delay element 76 and the delay amount of the delay element 78, the high-side switching element Q1 becomes OFF, and the dead time is generated until the low-side switching element Q2 becomes ON. The delay elements 76 to 78 are not required to have the same characteristics as the delay circuit 61, and therefore, the design thereof is easy.

Ninth Embodiment

Figure 20:
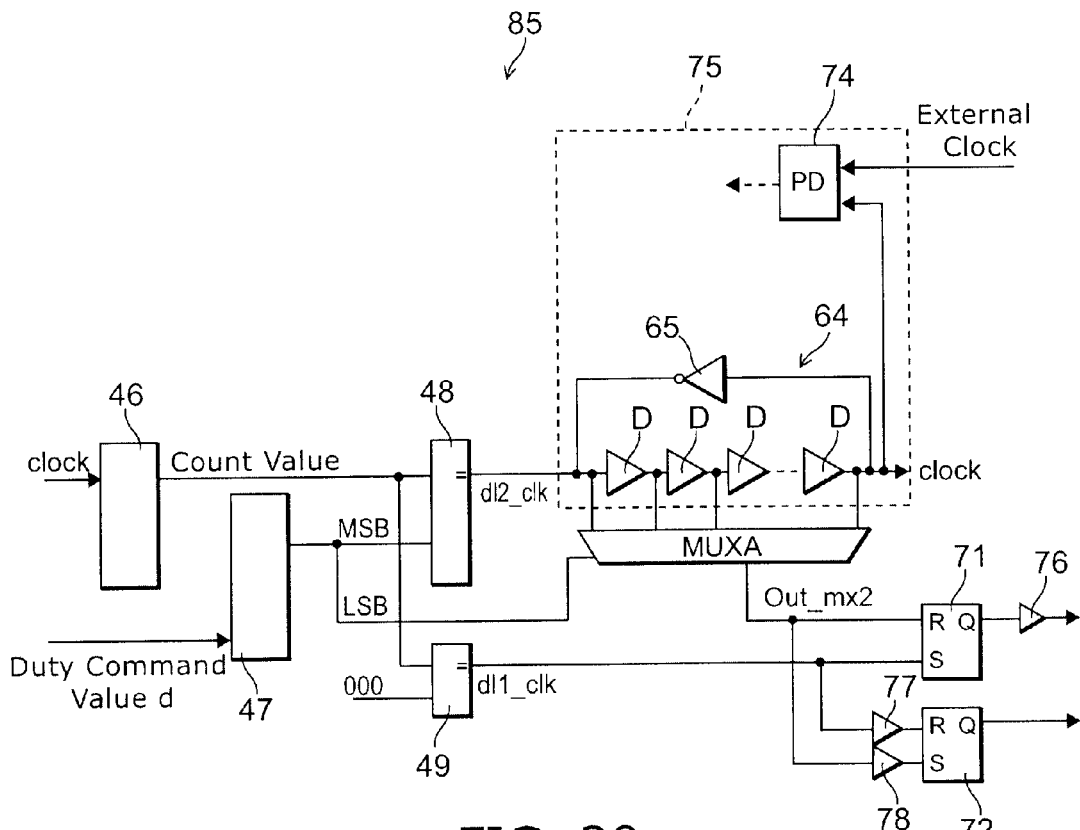
FIG. 20 is a circuit diagram showing still another structure example of the digital PWM circuit shown in FIG. 14 as a semiconductor device according to a ninth embodiment of the invention.

Like a digital PWM circuit 85 shown in FIG. 20, by using DLL/PLL 75 for the embodiment shown in FIG. 19, the internal clock (clock) can be synchronized with the external clock and maintained to be constant. When the system of the DC-DC converter is operated with being synchronized with the internal clock (clock), the characteristic improvement of the entire system can be achieved.

Tenth Embodiment

Figure 38:
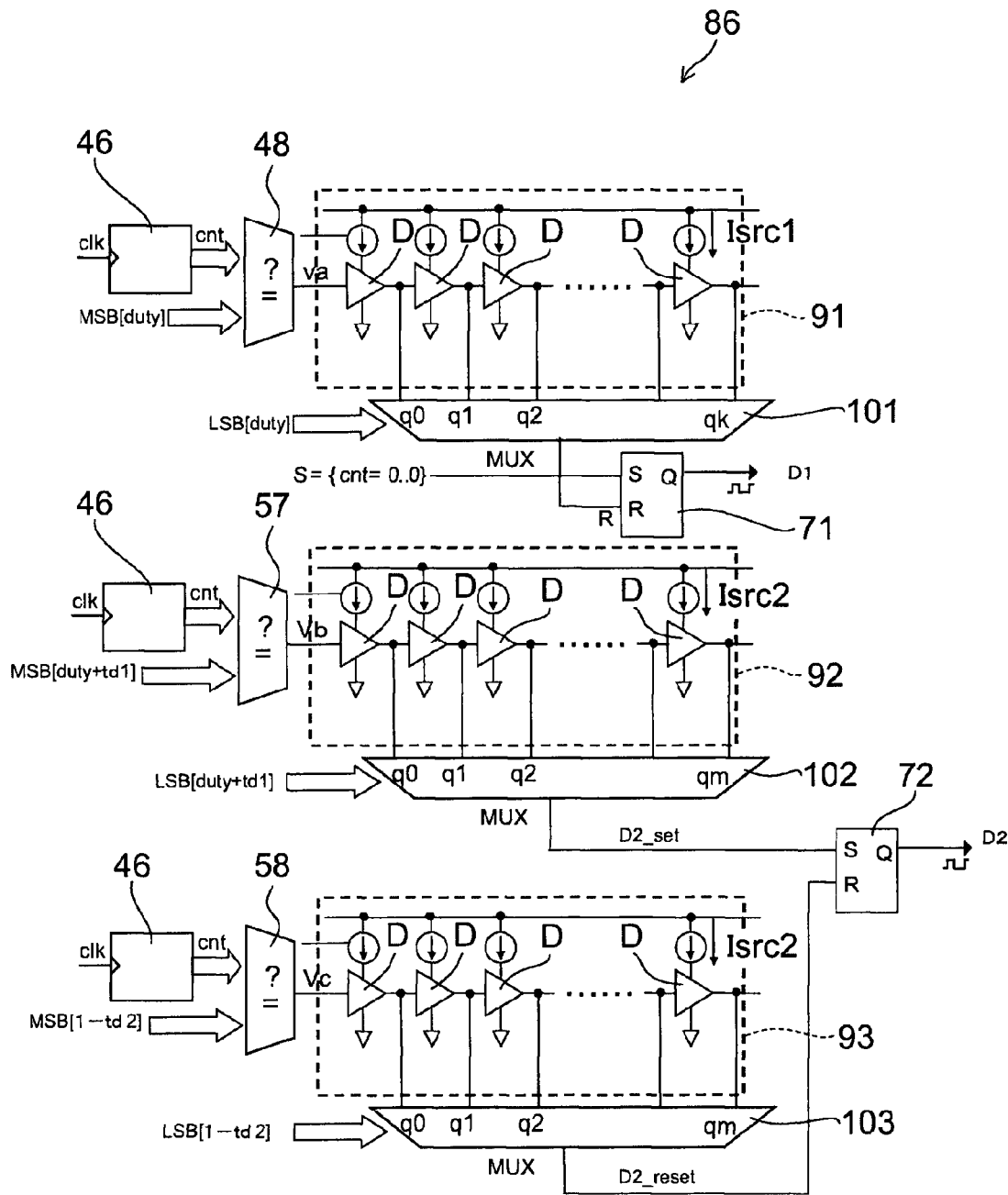
FIG. 38 is a circuit diagram showing a structure example of a digital PWM circuit in a semiconductor device according to a tenth embodiment of the invention.

FIG. 38 is a circuit diagram illustrating a structure of a digital PWM circuit 86 according to a tenth embodiment of the invention. This digital PWM circuit 86 has the same structure as the digital PWM circuit 81 in the fifth embodiment shown in FIG. 15.

Moreover, FIG. 39 is a timing chart of main signals in the digital PWM circuit 86 of this embodiment.

Figure 39A:
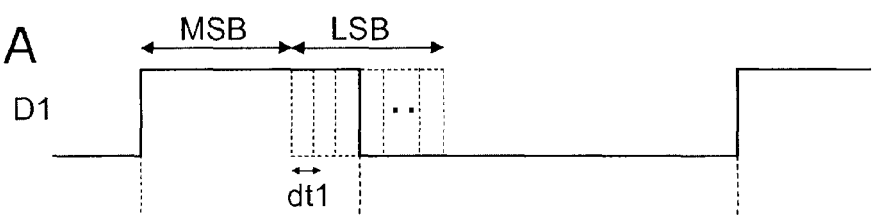
FIGS. 39A to 39D are waveform charts (timing chart) of the main signals in the circuit of FIG. 38.
Figure 39B:
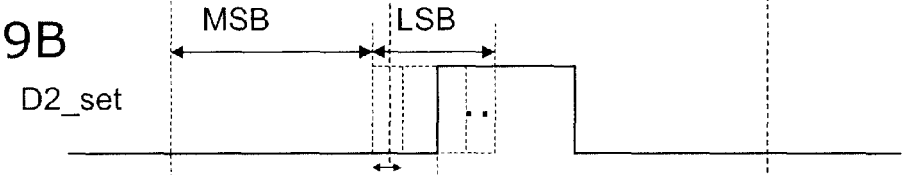
Figure 39C:
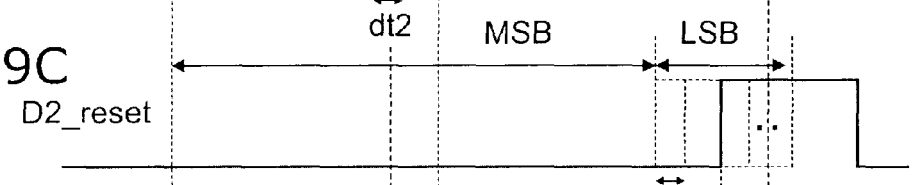
Figure 39D:
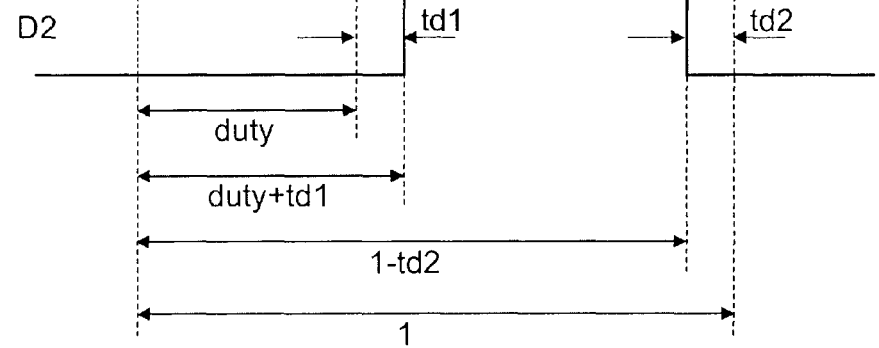

D1 of FIG. 39(a) represents a gate driving signal of the high-side switching element Q1 in the same manner as above-described FIG. 16(f), and D2 of FIG. 39(d) represents a gate driving signal of the low-side switching element Q2 in the same manner as FIG. 16(k).

The D2_set of FIG. 39(b) represents the output of the multiplexer 102 in the FIG. 38, and the D2_set corresponds to the out_mx4 (FIG. 16(h)) of the multiplexer MUXC in the circuit of FIG. 15. D2_reset of FIG. 39(c) represents the output of the multiplexer 103 in the circuit of FIG. 38, and the D2_reset corresponds to the output Out_mx3 (FIG. 16(j)) of the multiplexer MUXB in the circuit of FIG. 15.

Moreover, in FIG. 39, "duty" represents ON time in one period (one switching cycle) of D1, and "td1" represents a dead time after D1 becomes OFF from ON until D2 becomes ON from OFF, and "td2" represents a dead time after D2 becomes OFF from ON until D1 becomes ON from OFF.

The digital PWM circuit 86 according to the tenth embodiment shown in FIG. 38 has three delay circuits 91 to 93 and three multiplexers 101 to 103 provided so as to correspond to the delay circuits respectively.

Each of the delay circuits 91 to 93 has a plurality of stages of cascade-arranged delay elements D. Each of the delay elements D has the same circuit structure formed on the same semiconductor substrate. Moreover, in the delay circuit 92 and the delay circuit 93, the numbers (stage number) of the delay elements D are the same, and the control current Isrc2 supplied to each of the delay elements D is also the same.

In the former stages of the respective delay circuits 91 to 93, comparators 48, 57, 58 are provided, and to each of the comparators 48, 57, 58, the count value cnt of the counter 46 and, for example, a digital signal D [MSB] with top 3 bits of a 5-bit digital signal are input.

The counter 46 counts the clock signal clk (FIG. 16(a)) one by one (period by period) as shown in FIG. 16(b), and supplies the signal to each of the comparators 48, 57, 58 as, for example, 3-bit count value.

At the timing that the count value agrees with the MSB [duty], the comparator 48 outputs the signal va (corresponding to dl2_clk of FIG. 16(d)) having a pulse width of one clock period, to the delay circuit 91. The signal va transmits through each of the delay elements D sequentially from the first stage and generates delay in the rising timing of the output signal of each of the delay elements D.

The output signal of each of the delay elements D in the delay circuit 91 is input to multiplexer 101. The multiplexer 101 selects one from the output signals of the respective delay elements D on the basis of the digital signal LSB[duty] and output the one to the reset terminal R of the flipflop 71. The reset pulse corresponds to Out_mx2 of FIG. 16(e).

Moreover, to the set terminal of the flipflop 71, the set pulse (corresponding to dl1_clk of FIG. 16(c)) is input at the timing of being synchronized with the clock signal.

The flipflop 71 outputs the signal D1 (corresponding to signal of FIG. 16(f)) shown in FIG. 39(a) from the output terminal Q. This output signal switches from the low level to the high level at the timing that the set pulse switches from the low level to the high level, and the high level is held while the reset pulse (output of the multiplexer 101) is in the low level, and the high level switches to the low level at the timing that the reset pulse switches from the low level to the high level. The output signal D1 of the flipflop 71 is supplied to control terminal (gate) of the high-side switching element Q1, and based thereon, ON/OFF of the switching element Q1 is switched.

That is, the rising timing of the switching pulse for switching ON/OFF of the high-side switching element Q1 is set at the timing of being synchronized with clock signal (clock), and the falling timing is set by the smaller time resolution than that of the clock signal by utilizing a signal delay in the delay circuit 91.

For the switching pulse for switching ON/OFF of the low-side switching element Q2, both of rising and falling timings are set by smaller time resolution than that of the clock signal by using the delay circuits 92, 93 in order to enhance precision of the above-described dead time adjustment.

That is, the comparator 57 outputs the signal vb having a pulse width of one clock period to the delay circuit 92 at the timing that the count value agrees with MSB [duty+td1]. This signal vb transmits through each of the delay elements D sequentially from the first stage, and delay is generated in the rising timing of the output signal of each of the delay elements D.

The output signal of each of the delay elements D in the delay circuit 92 is input to the multiplexer 102. The multiplexer 102 selects one of output signals of the respective delay elements D on the basis of the signal LSB [duty+td1] and outputs the one to the set terminal S of the flipflop 72 as the set pulse D2_set (FIG. 39(*b*)).

The comparator 58 outputs the signal vc having a pulse width of one clock period to the delay circuit 93 at the timing that the count value agrees with MSB [1−td2]. This signal vc transmits through each of the delay elements D of the delay circuit 93 sequentially from the first stage, and delay is generated in the rising timing of the output signal of each of the delay elements D.

The output signal of each of the delay elements D in the delay circuit 93 is input to the multiplexer 103. The multiplexer 103 selects one of output signals of the respective delay elements on the basis of the signal LSB [1−td2] and outputs the one to the reset terminal R of the flipflop 72 as the reset pulse D2_reset (FIG. 39(*c*)).

The flipflop 72 outputs the signal D2 shown in FIG. 39(*d*) from the output terminal Q. This output signal D2 switches from the low level to the high level at the timing that the set pulse D2_set switches from the low level to the high level, and the high level is held while the reset pulse D2_reset is in the low level, and the high level switches to the low level at the timing that the reset pulse D2_reset switches from the low level to the high level. The output signal D2 of the flipflop 72 is supplied to control terminal (gate) of the low-side switching element Q2, and based thereon, ON/OFF of the switching element Q2 is switched.

For enhancing voltage precision of the output voltage in the DC-DC converter, the driving signal D1 of the high-side switching element Q1 is required for being generated in a high time resolution. Therefore, for the delay elements D composing the delay circuit 91 setting the falling timing of D1, it is required to supply the control current Isrc1 that is large to some extent in order to shorten the delay time thereof.

Moreover, for shortening the time resolution with respect to the clock period, the number of the delay elements D becomes larger, and when there are three such delay circuits, the occupied area of the digital PWM circuit in the chip becomes large.

On the other hand, in generating the driving signal D2 of the low-side switching element Q2, the time resolution being as high as that of the high-side driving signal D1 is not required. For example, if the time resolution of the high-side driving D1 is 100 picoseconds, the time resolution of the low-side driving signal D2 is sufficient to be about 1 nanosecond, which is ten-times lower. This is because even if the ON/OFF timing of the low-side switching element Q2 is changed by a unit of 100 picoseconds, conversion efficiency of the power is not affected.

Accordingly, in this embodiment, when the time resolution of the driving signal D1 is dt1 as shown in FIG. 39, the time resolution dt2 of each of the D2_set signal determining the rising timing of the driving signal D2 and the D2_reset signal determining the falling timing thereof is set to be longer than dt1 (dt1<dt2).

Specifically, in the circuit of FIG. 38, the current Isrc2 supplied to each of delay elements D in delay circuits 92, 93 is decreased to be smaller than the current Isrc1 supplied to each of delay elements D of the delay circuit 91 (Isrc1>Isrc2). For example, when n is an integer of 1 or more, the relation of Isrc1=Isrc2×$2^n$ can be provided. However, in this case, the relation that the delay time of each of delay elements D is proportional to the current supplied to each of the delay elements D is established. As the current supplied to the delay elements is smaller, the time for charging the gate capacity is required more by the amount thereof, and the delay time per delay element is longer, and the dt1<dt2 can be realized. Moreover, to reduce the current supplied to the delay circuits 92, 93 is to be capable of making the consumption current smaller.

As described above, the delay time becomes longer as the current flowed through the delay elements is set to be smaller, but when the delay time becomes long, there is danger that the total delay amount by the entire delay elements comes not to be contained in one clock period, and therefore, in this embodiment, the numbers (stage numbers) of the delay elements in the delay circuits 92, 93 is decreased to be smaller than the number (stage number) of the delay elements of the delay circuit 91. That is, when the number of the delay elements of the delay circuit 91 is (k+1) and the number of delay elements in each of the delay circuits 92, 93 is (m+1), k>M is established. Furthermore, when n is an integer of 1 or more, the relation of (k+1)=(m+1)×$2^n$ can be provided. By reducing the number of the delay elements, not only the occupied area of the delay elements can be reduced but also the circuit scale of the multiplexers 102, 103 receiving the outputs of the respective delay elements can be smaller.

That is, according to this embodiment, without affecting the power conversion efficiency very much, cost down by reduction of power consumption or reducing of circuit scale can be achieved.

In the above explanation, in the delay circuit 92 and the delay circuit 93, the number of the delay elements is set to be the same m, and the supplied current is set to be the same Isrc2, but by the two delay circuits 92, 93, the number of the elements or the supplied current may be set to be different.

Figure 36:
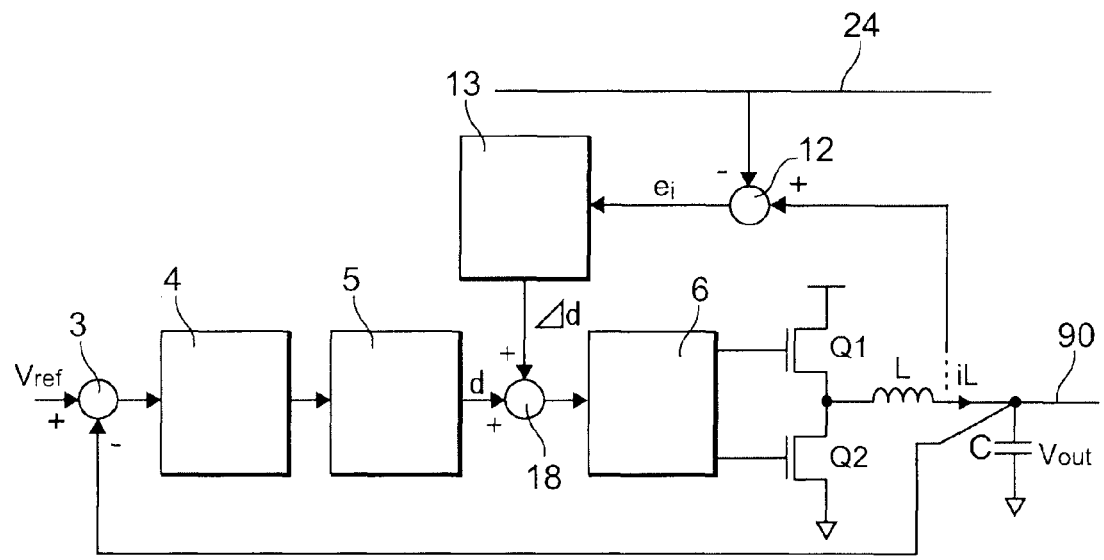
FIG. 36 is a schematic view showing a structure example of each DC-DC converter shown in FIG. 31.

In FIG. 36, in the regenerative period in which the load current iL is small and the high-side switching element Q1 is OFF and the low-side switching element Q2 is ON, there is a mode that the magnetic energy of the inductor L becomes 0 at a certain time and that the current flows from the output terminal through the low-side switching element Q2 to the ground. In this case, not only the charge is lost from the condenser in the output terminal but also conduction loss is caused by ON resistance of Q2 by the current flowing through the switching element Q2. Thereby, the conversion efficiency of the power is significantly degraded.

Accordingly, it is desirable that in the period that the current flows from the output terminal through the low-side switching element Q2 to the ground, Q2 is set to be OFF. By setting Q2 to be OFF, the loss is not caused because the path of the current does not exist, the conversion efficiency of the power can be improved.

It can be easily thought that for the timing of setting Q2 to be OFF, sufficient time before the magnetic energy of the inductor L becomes 0 is taken for setting OFF. In this case, because the magnetic energy of the inductor L is not 0, the current continues to flow through the internal diode of Q2. In this case, because the internal diode has high ON voltage in comparison to the MOS structural part, the conduction loss becomes large compared to the case that the MOS structural part is ON. Therefore, the time resolution of td2 is occasionally required more than that of td1 for improving the efficiency. In this case, the number of the delay elements D of the delay circuit 93 is set to be larger than the number of the delay elements D of the delay circuit 92.

At any rate, in the delay circuits 92, 93, it is necessary that the number of the delay elements is set to be smaller than that of the delay circuit 91 and that the supplied current is also set to be smaller than that of the delay circuit 91.

Eleventh Embodiment

Figure 40:
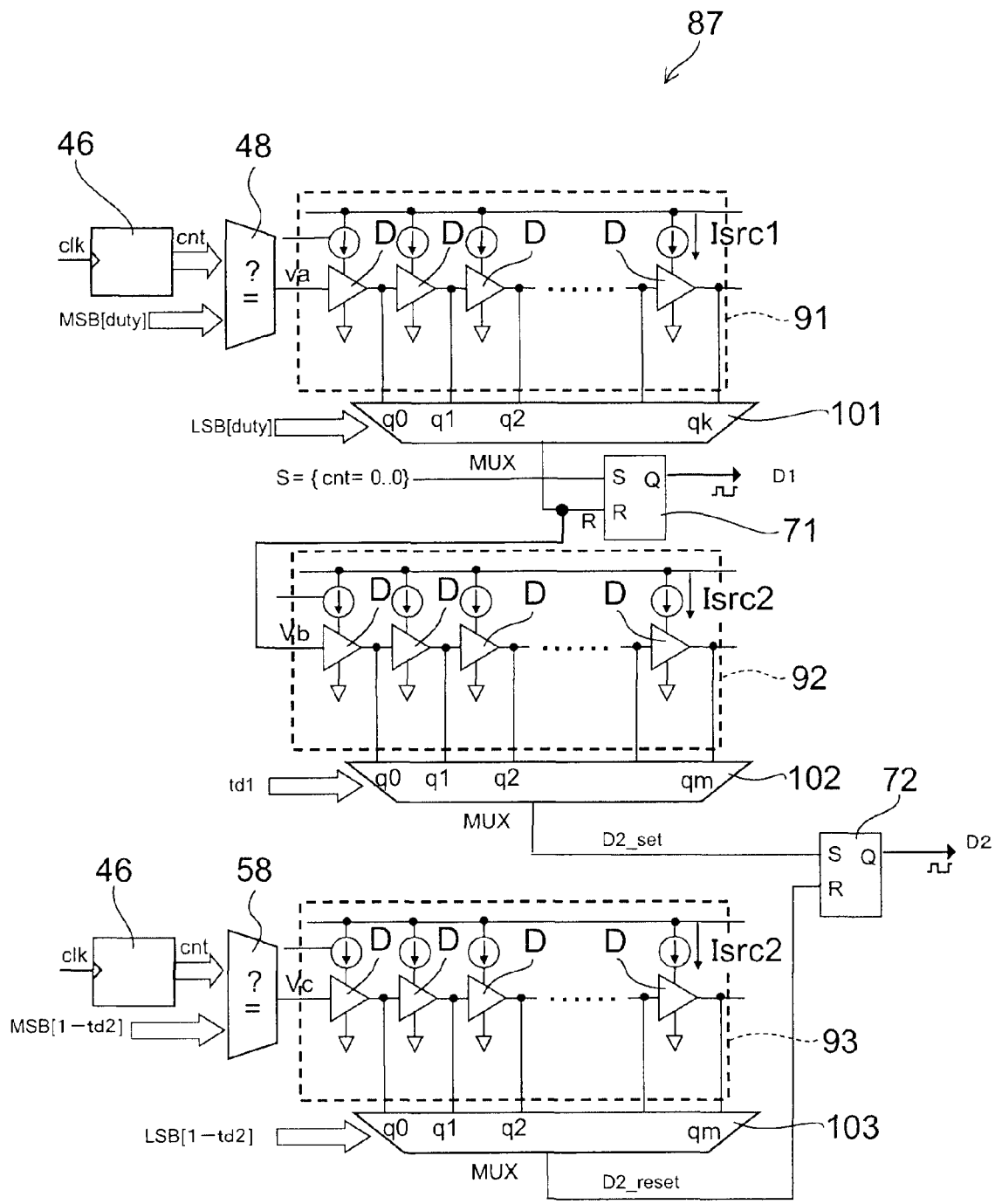
FIG. 40 is a circuit diagram showing a structure example of a digital PWM circuit in a semiconductor device according to a eleventh embodiment of the invention.

FIG. 40 is a circuit diagram illustrating a structure of a digital PWM circuit 87 according to an eleventh embodiment of the invention.

In the above-described tenth embodiment, as shown in FIG. 39, the set pulse D2_set of D2 counts MSB[duty+td1] by the counter 46, and compares LSB[duty+td1] therewith by the comparator 57, and inputs the signal to the delay circuit 92. In this structure, for the dead time td1, a negative value can also be set. The negative value of td1 corresponds to the case that the falling timing of D2 is set to be before the falling timing of D1. When the ON time of the low-side switching element is extremely larger than the OFF time of the high-side switching element, td1 is required to be set to be negative, but in general, the high-side and low-side switching elements whose ON time and OFF time are extremely different are not used. Accordingly, td1 rarely becomes negative.

Accordingly, in this embodiment, as shown in FIG. 40, the signal (output of the multiplexer 101) generating the reset pulse of D1 is input to the delay circuit 92 generating the set pulse D2_set of D2. Thereby, rising of D2 is generated on the basis of falling of D2, and therefore, the counter 46 and the comparator 57 at the former stage of the delay circuit 92 becomes unnecessary, and the circuit scale can be smaller than that of the tenth embodiment.

In this embodiment, in the same manner as the tenth embodiment, in each of the delay circuits 92, 93, the number of the delay elements is set to be smaller and the supplied current is also set to be smaller than that of the delay circuit 91, and thereby, the time resolution dt2 of each of the D2_set signal determining the rising timing of the driving signal D2 and the D2_reset signal determining the falling timing thereof may be longer than the time resolution dt1 of the driving signal D1 (dt1<dt2), and also, dt2=dt1 is possible.

Moreover, in the same manner as the tenth embodiment, in the delay circuit 92 and the delay circuit 93, the number of the delay elements is set to be the same m, and the supplied current is also set to be the same Isrc2, but the number of the elements or the supplied current may be set to be different between the two delay circuits 92, 93.

Twelfth Embodiment

Figure 21:
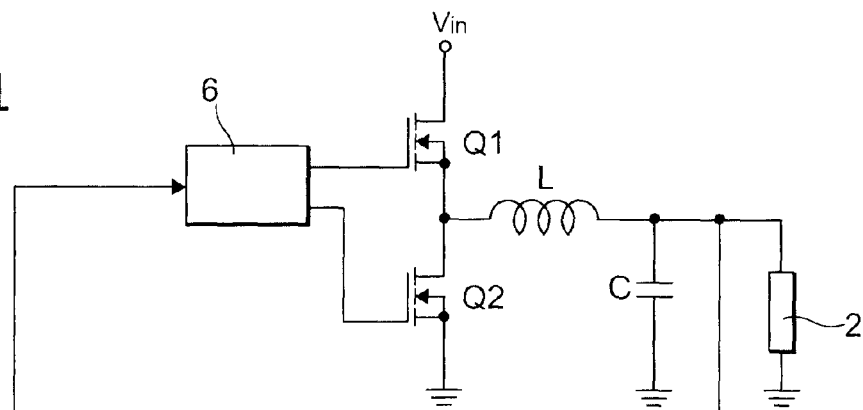
FIG. 21 is a circuit diagram showing one structure example of an output voltage control circuit in a DC-DC converter as a semiconductor device according to an twelfth embodiment of the invention.

Next, one specific example of the structure corresponding to the comparator 3 and the A/D conversion circuit 4 in the structure shown in the above-described FIG. 14 will be explained. FIG. 21 is a schematic view illustrating a structure of DC-DC converter according to a twelfth embodiment of the invention. The same signs are appended to the same components as the above-described embodiments.

The output voltage Vout of the switching power circuit having the switching elements Q1, Q2 and the inductor L and the condenser C is compared to the target output voltage in the error signal generation circuit having the D/A conversion circuit 7 and the comparators 3a to 3f and the A/D conversion circuit 4, and the error signal e corresponding to the difference between the output voltage Vout and the target output voltage is generated.

Figure 22:
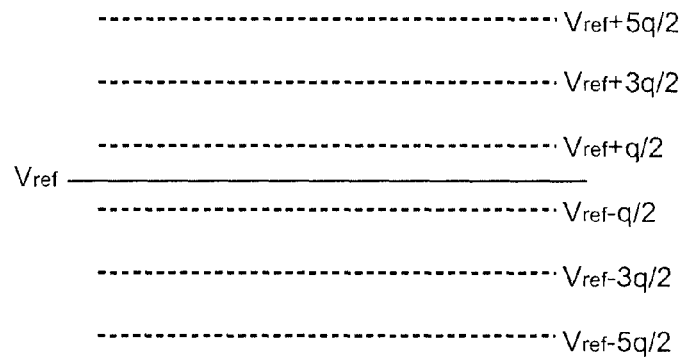
FIG. 22 is a schematic view showing one example of thresholds (Bin) set in comparing the reference voltage Vref with the output voltage in the circuit in FIG. 21.

Specifically, the output voltage Vout is input to the comparator 3a to 3f and compared with the target output voltage (reference voltage Vref). In the D/A conversion circuit 7, as shown in FIG. 22, a plurality of stages (six in the example shown in the figure) of Bin (thresholds) are set, and supplied to each of the comparators 3a to 3f as the analog voltages.

The comparator 3a compares Vref and (Vref+q/2), and the comparator 3b compares Vref and (Vref−q/2), and the comparator 3c compares Vref and (Vref+3q/2), and the comparator 3d compares Vref and (Vref−3q/2), and the comparator 3e compares Vref and (Vref+5q/2), and the comparator 3f compares Vref and (Vref−5q/2).

The A/D conversion circuit 4 receives the comparison result of the comparators 3a to 3f, and outputs the control parameter for compensating the disagreement amount of the output voltage Vout with respect to the target output voltage (reference voltage Vref), as the error signal (digital value) e to the compensator 5.

The A/D conversion circuit 4 determines the error signal e with reference to Look Up Table in which the corresponding relation between Bin (q/2, −q/2, 3q/2, −3q/2, 5q/2, −5q/2) and the control parameter (q, −q, 3q, −3q, 5q, −5q) is preliminarily written.

When the output voltage Vout becomes larger than Vref and disagrees to reach (Vref+q/2), the error signal e corresponding to the control parameter "q" is output, and when the output voltage Vout becomes smaller than Vref and disagrees to reach (Vref−q/2), the error signal e corresponding to the control parameter "−q" is output, and when the output voltage Vout becomes larger than Vref and disagrees to reach (Vref+3q/2), the error signal e corresponding to the control parameter "2q" is output, and when the output voltage Vout becomes smaller than Vref and disagrees to reach (Vref−3q/2), the error signal e corresponding to the control parameter "−2q" is output, and when the output voltage Vout becomes larger than Vref and disagrees to reach (Vref+5q/2), the error signal e corresponding to the control parameter "3q" is output, and when the output voltage Vout becomes smaller than Vref and disagrees to reach (Vref−5q/2), the error signal e corresponding to the control parameter "−3q" is output.

The compensator 5 calculates the duty command value d on the basis of the error signal e and outputs the duty command value d to the digital PWM circuit 6. For example, with reference to Look Up Table in which the corresponding relation between the error signal e and the duty command value d calculated with respect to the error signal is preliminarily written, the duty command value d is determined.

Like the above-described embodiments, the digital PWM circuit 6 generates a switching pulse provided to the gate of the high-side switching element Q1 and a switching pulse provided to the gate of the low side switching element Q2, and supplies the switching pulses to each of the switching elements Q1, Q2.

Thirteenth Embodiment

Figure 23:
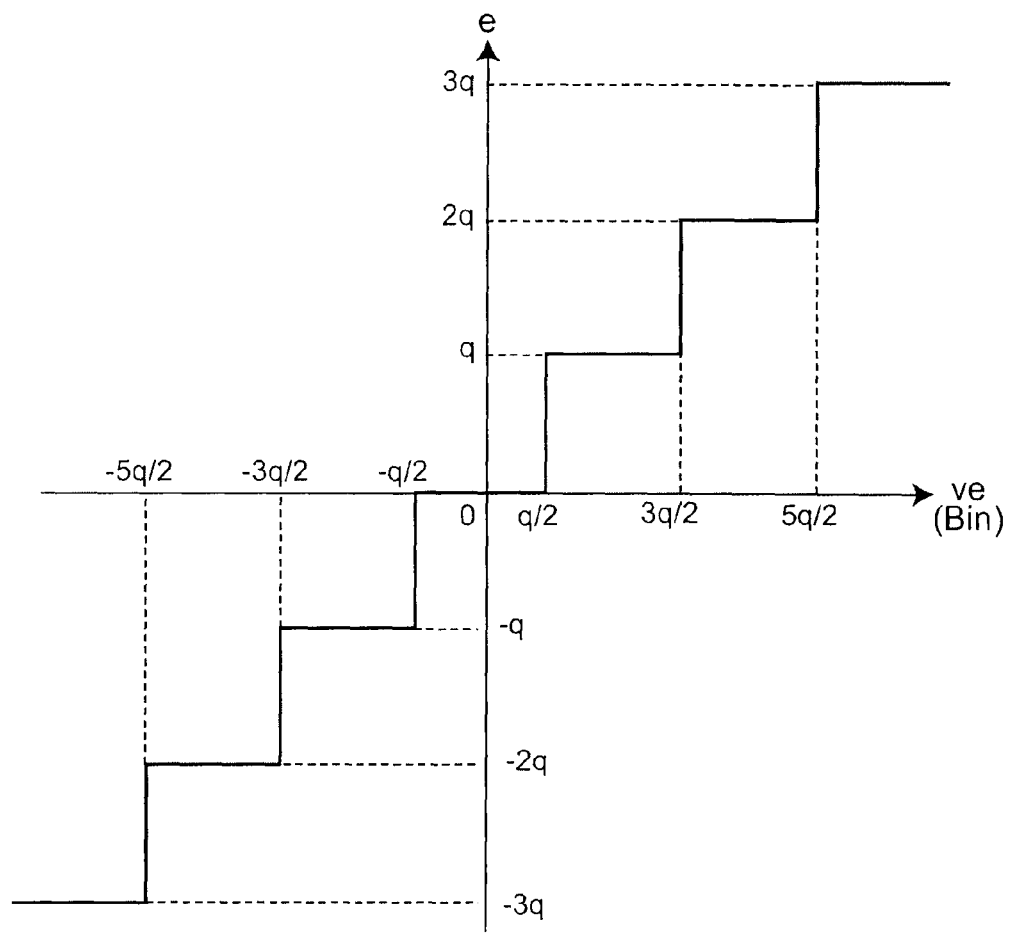
FIG. 23 is a schematic view showing the corresponding relation between the thresholds shown in FIG. 22 and the control parameter set in accordance with this.
Figure 24:
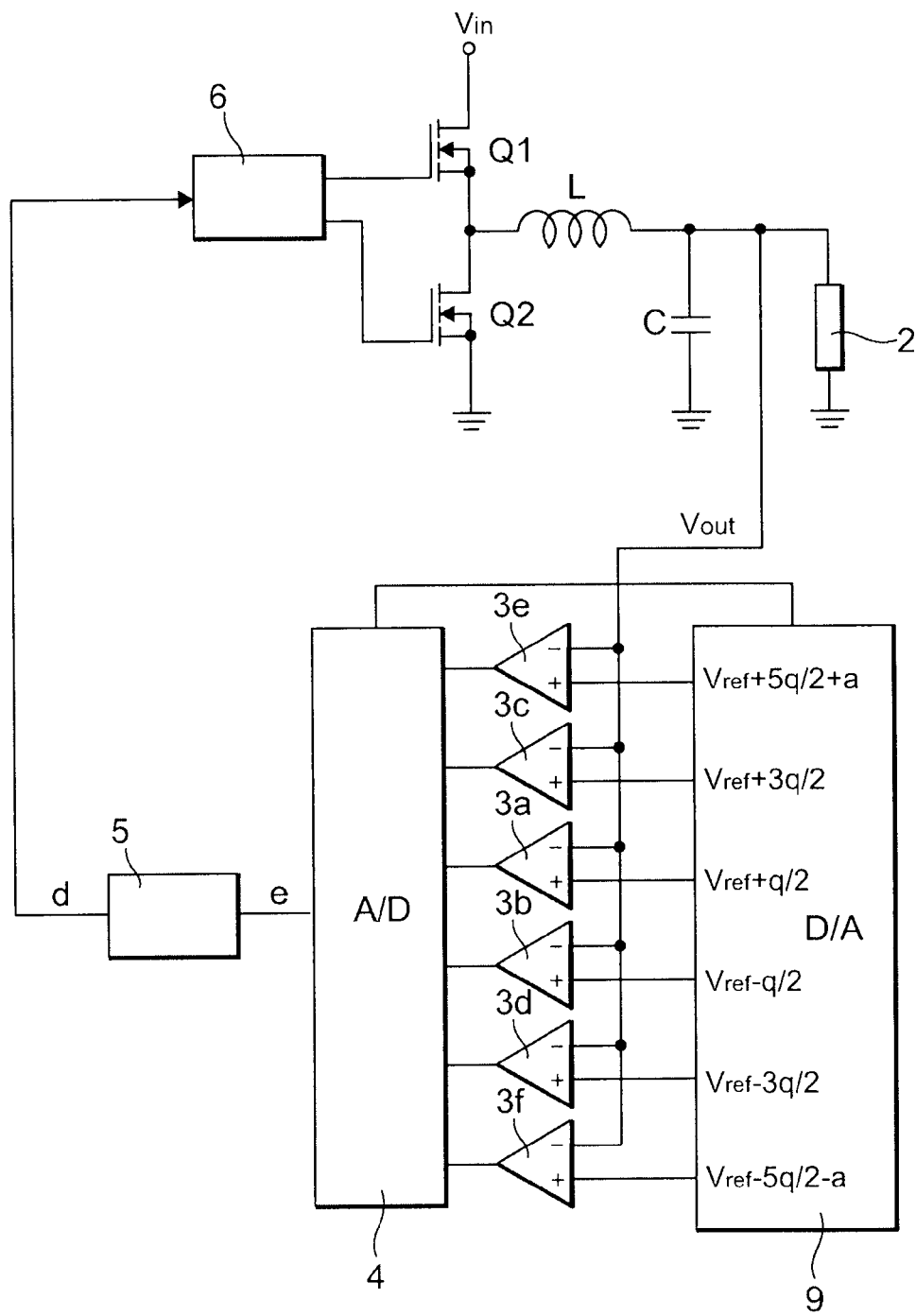
FIG. 24 is a circuit diagram showing one structure example of an output voltage control circuit in a DC-DC converter as a semiconductor device according to an thirteenth embodiment of the invention.
Figure 25:
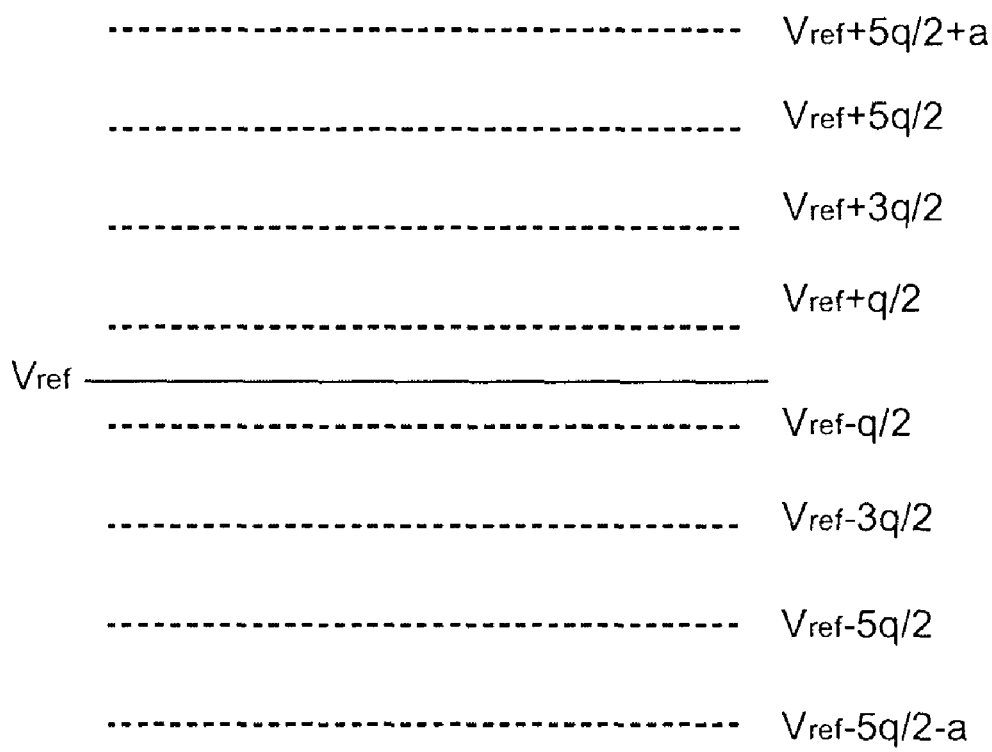
FIG. 25 is a schematic view showing one example of thresholds (Bin) set in comparing the reference voltage Vref with the output voltage in the circuit in FIG. 24.
Figure 26:
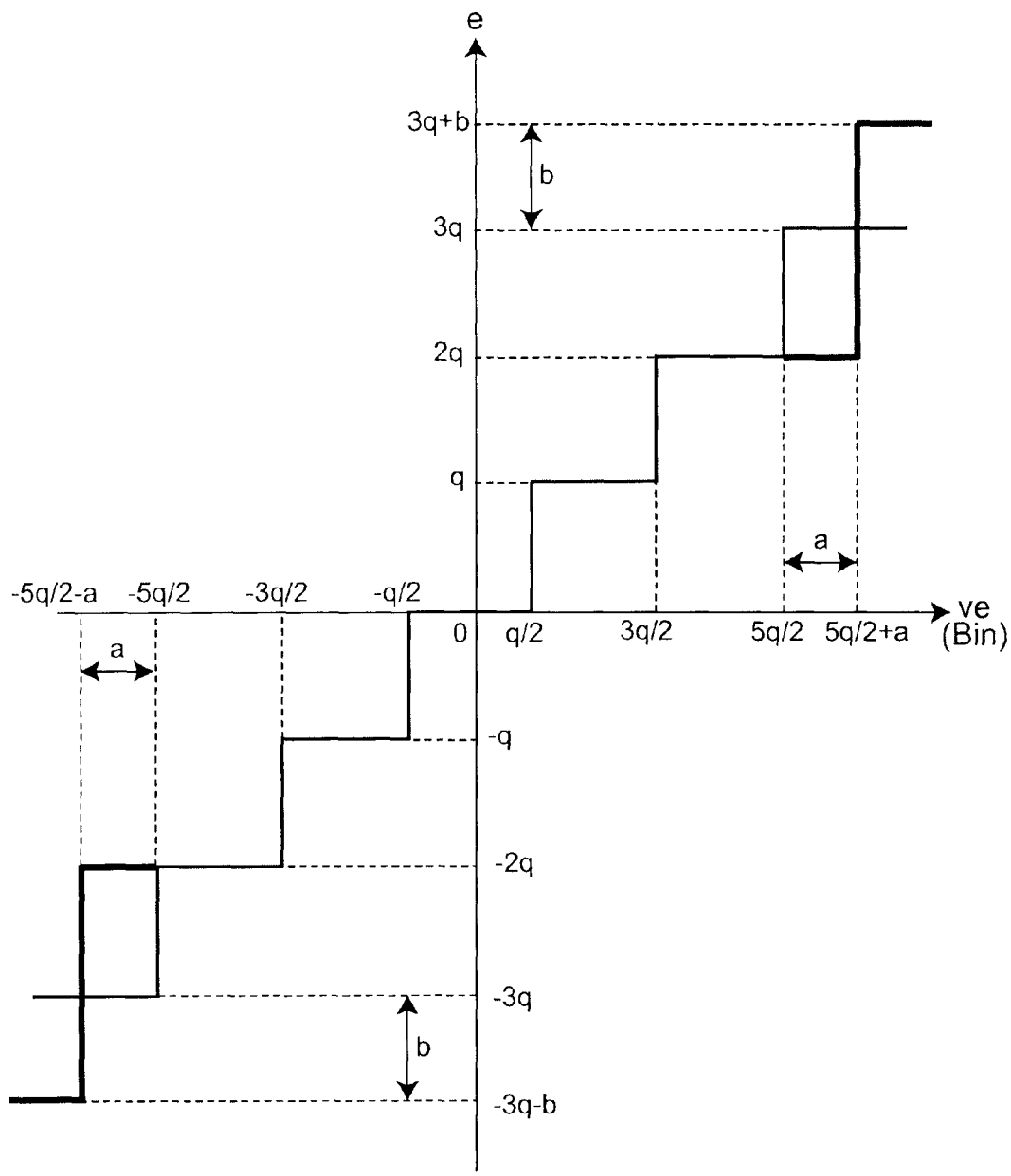
FIG. 26 is a schematic view showing the corresponding relation between the thresholds shown in FIG. 25 and the control parameter set in accordance with this.

Next, with reference to FIGS. 24 to 26, a thirteenth embodiment of the invention will be explained. FIGS. 24, 25, 26 correspond to above-described FIGS. 21, 22, 23, respectively.

When the output voltage Vout is changed rapidly by rapid change of the charge, if the disagreement amount with respect to Vref comes to exceed the uppermost or lowermost Bin, the control parameter becomes quite the same (3q or −3q) in the region thereof no matter how far Vout is separate from Vref, and therefore, when Vout disagrees so as to be extremely larger than (Vref+5q/2) or when Vout disagrees so as to be extremely smaller than (Vref−5q/2), Vout does not converge to Vref only by the control of one time of the control parameter (3q or −3q), and the control by the control parameter (3q or −3q) becomes repeated at several times, and time is required for making Vout converge to Vref. That is, if Bin width and the control parameter are fixed, the control response with respect to large rapid change of the charge is degraded.

Accordingly, in this embodiment, to the uppermost Bin (Vref+5q/2) and the lowermost Bin (Vref−5q/2), parameters of (+a) and (−a) can be added, respectively. Furthermore, as shown in FIG. 26, the control parameter (3q+b) corresponding to Bin [(Vref+5q/2)+a] and the control parameter (−3q−b) corresponding to Bin [(Vref−5q/2)−a] are written in Look Up Table. For a, a plurality of values can be set, and correspondingly, b can be a plurality of values.

First, for example, a=0 and b=0 are set. When the load rapidly decreases and the output voltage Vout exceeds (Vref+5q/2), the value of a is set to be a larger value (correspondingly the value of b becomes larger), the uppermost Bin is changed from (Vref+5q/2) to [(Vref+5q/2)+a], and at the same time, the control parameter (3q+b) corresponding to Bin[(Vref+5q/2)+a] is read from Look Up Table, and the error signal e corresponding to the control parameter (3q+b) is output.

That is, when the output voltage Vout disagrees to be larger than Vref, by enhancing Bin width correspondingly, the larger control parameter can be used and the output voltage Vout can be made to converge to Vref in a short time, and response in the control operation of setting the output voltage Vout to be a desired target value can be enhanced.

Also, the case that the load rapidly increases can be thought similarly, and when the output voltage Vout becomes smaller than (Vref−5q/2), the value of a (absolute value) is set to be larger than 0, and the lowermost Bin is changed from (Vref−5q/2) to [(Vref−5q/2)−a], and simultaneously, the control parameter (−3q−b) corresponding to Bin [(Vref−5q/2)−a] is read from Look Up Table, and the error signal e corresponding to control parameter (−3q−b) is output.

As described above, according to this embodiment, in operating the power circuit, the uppermost or lowermost Bin width is changed according to the change width of the output voltage Vout, and the control parameter is changed to be a larger control parameter, and thereby, the response with respect to the large rapid change of the charge (convergent property of Vout to the target value) can be improved.

In the above-described embodiment, the specific examples of changing uppermost and lowermost Bin widths has been exemplified, but by appropriately changing the Bin widths of the other positions similarly, the improvement of response can be expected.

Next, the embodiment that a plurality of DC-DC converters are connected in parallel and driven in parallel will be explained.

Fourteenth Embodiment

Figure 27:
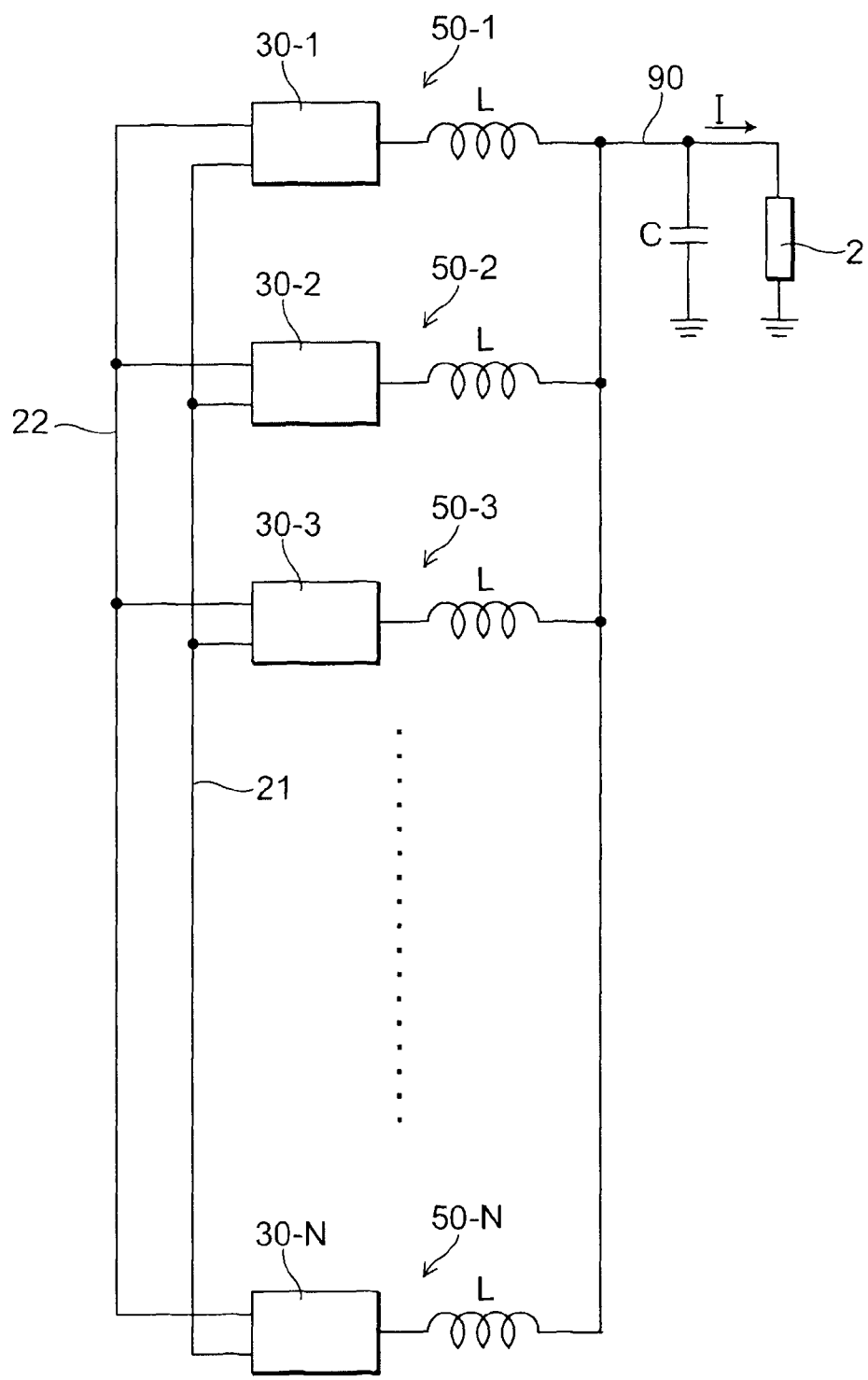
FIG. 27 is a schematic view showing the structure of a digital control power source as a semiconductor device according to a fourteenth embodiment of the invention.

FIG. 27 is a schematic view showing a structure of a digital control power source according to a fourteenth embodiment.

A plurality of DC-DC converters 50-1, 50-2, . . . 50-N are connected in parallel between the input voltage source 1 (see, FIG. 14) and the output terminal. The output side of the inductor L of each of the DC-DC converters 50-1, 50-2, . . . 50-N is connected in parallel to the common output line 90. In the output line 90, a condenser C and the load 2 are commonly connected to each of the DC-DC converters 50-1, 50-2, . . . 50-N.

The power ICs 30-1, 30-2, . . . 30-N of the respective DC-DC converters 50-1, 50-2, . . . 50-N correspond to the power IC 30 surrounded by dashed line in FIG. 14. As the digital PWM circuit 6 and the comparator 3 and the A/D conversion circuit 4 in each of the power ICs 30-1, 30-2, . . . 30-N, the ones having the structures described above with reference to FIGS. 1 to 26 and 38 to 40 can be appropriately used.

The power ICs 30-1, 30-2, . . . 30-N have the same structures, and the inductors L also have the same structures, and therefore, the DC-DC converters 50-1, 50-2, . . . 50-N have the same structures, and the same output voltage can be output in principle. Furthermore, each of the DC-DC converters 50-1, 50-2, . . . 50-N (the power ICs 30-1, 30-2, . . . 30-N) has the capability of becoming the master (function of being capable of supplying reference signal or the like to the other converters).

When the output current of each of the DC-DC converters 50-1, 50-2, . . . 50-N is, for example, 10 amperes, if, for example, 10 converters are connected in parallel and operated in parallel, a power source having an output current of 100 amperes can be composed. This can be more insufficient than the case that one DC-DC converter having an output current of 100 amperes is used.

Figure 28A:
FIGS. 28A and 28B are schematic views for describing the multiphase operation in a parallel operation power source.
Figure 28B:
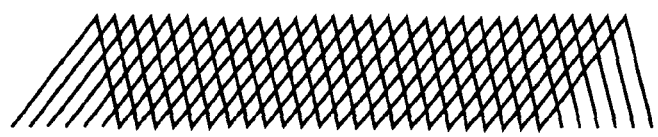

Moreover, the output voltage of each of the DC-DC converters 50-1, 50-2, . . . 50-N has a ripple as shown in FIG. 28A, but when each of the DC-DC converters 50-1, 50-2, . . . 50-N is operated (multiphase-operated) so that phases of output voltages of the respective DC-DC converters 50-1, 50-2, . . . 50-N come to disagree little by little as shown in FIG. 28B, the ripple can be reduced.

The power ICs 30-1, 30-2, . . . 30-N are connected to a common (one) data bus 22. Furthermore, the power ICs 30-1, 30-2, . . . 30-N are connected to a common (one) synchronization signal line 21. Through them, the power ICs 30-1, 30-2, . . . 30-N communicate to one another.

First, on start-up, the power IC to be a reference of the output voltage phase 0° is determined. Here, for example, the power IC 30-1 is made to be the power IC. The power IC outputs the internal reference clock from SYNC terminal (not shown) to the synchronization signal line 21, and the other power ICs 30-2, . . . 30-N receive the reference clock from each of the SYNC terminals through the synchronization signal line 21, and operates with being synchronized with the reference clock by using, for example, the above-described structure such as PLL. That is, all of the DC-DC converters 50-1, 50-2, . . . 50-N operate with being synchronized with the same reference clock.

Moreover, the power IC 30-1 indicates a phase shift value of the output voltage through the data bus 22 to the other power ICs 30-2, . . . 30-N. Each of the power ICs 30-2, . . . 30-N except for the power IC 30-1 receives the phase shift value through the data bus 22, and as shown in FIG. 28B, phases of output voltages of the respective power ICs 30-1, 30-2, . . . 30-N are made to disagree with one another, and the ripple is reduced.

All of the power ICs 30-1, 30-2, . . . 30-N operate with being synchronized with the reference clock of the power IC 30-1. Therefore, if a trouble is caused in the reference clock inside the power IC 30-1, the entire system becomes failed. For preventing this, the power IC 30-1 has a function of detecting its own trouble, and if the trouble is detected, the sequence data of which power IC is next made to function as the master is indicated through the data bus 22. Therefore, all of the power ICs 30-1, 30-2, ... 30-N can be the reference IC having a phase of 0° and have a function of indicating the phase shift value to the other power ICs. If a trouble is caused in the power IC functioning as the master, another normally operating power IC functions as the master instead of the troubled power IC, and therefore, the reliability of the entire system can be enhanced.

As described above, in this embodiment, the power ICs communicate to one another and can autonomously set the interleaving, and therefore, even if a trouble is caused in any one power IC, the system of the entire DC-DC converters is not failed, and therefore, the reliability can be enhanced.

Fifteenth Embodiment

In a digital control power source in which N DC-DC converters (power ICs) having the same structures are driven in parallel, for maximizing efficiency (output power/input power), how each of the power ICs is operated is important. In particular, when the entire output current comes to decrease in such a case as light load, compared to the case in which the current of the entire current I divided by N (I/N) is flowed to each of N power ICs, the efficiency becomes high in the case in which the operation of some power ICs out of the N power ICs is stopped and only Nop (<N) power ICs are operated and the current of (I/Nop) is flowed to each of the operating power ICs.

Figure 29:
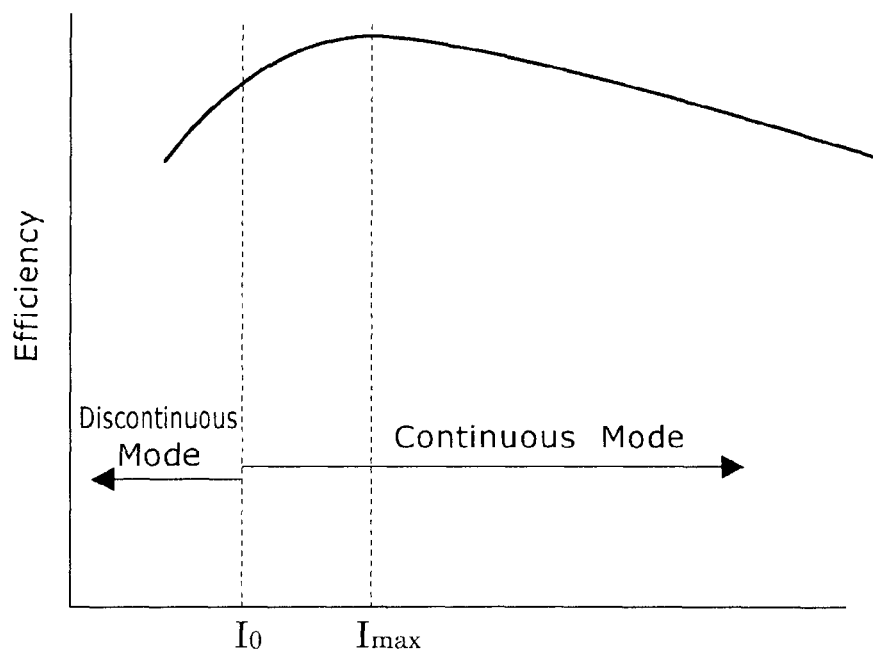
FIG. 29 is a graph showing the relation between a current flowing through each of power ICs and the efficiency in a digital control power source as a semiconductor device according to a fifteenth embodiment of the invention.

In general, when the output current becomes small in the DC-DC converter, the efficiency becomes lower as shown in FIG. 29. In this case, consumption current of the control circuit or power for charging and discharging the gate of the power stage (switching elements Q1, Q2) does not change and does not decrease even when the output current of the DC-DC converter changes. Accordingly, as the output power comes to decrease, the efficiency (output power/input power) lowers.

When the entire output current decreases and therewith the output current of each of N power ICs lowers and the efficiency of the current becomes lower than the peak, operation of at least one or more power ICs out of N power ICs is stopped and the current flowing through the individual operating power source ICs is held to be high, and thereby, the efficiency can be held to be high. The power ICs whose operation is stopped are naturally the power ICs except for the power IC functioning as the master.

In the example of FIG. 29, when the value of (entire current I/operation number Nop) becomes smaller than the current Imax in which the efficiency becomes the peak, if the operation number Nop is reduced to suppress the current value (I/Nop) flowing through each of the power ICs to be in the vicinity of Imax, the efficiency can be held to be high.

When Nop power ICs are operating now and the entire output current is I, the current of approximately (I/Nop) flows through each of the power ICs. And, when (I/Nop) becomes smaller than the preliminarily determined current value, X power ICs out of Nop power ICs are stopped. In order that the residual (Nop−X) power ICs share and continuously flow the entire current I, the value of the current flowing through each of the (Nop−X) power ICs is set to be [Nop/(Nop−X)]-times larger.

For the power IC whose operation is stopped, because operations of a large part of the control circuit and the power stage (switching elements Q1, Q2) are stopped, the power consumption becomes almost zero. The operating circuit comes to be only the part waiting so as to be capable of operating by receiving the input of the signal when the current increases.

In determining the number Nop of the power ICs made to operate, as describe later, (I/Nop) by which each of the power ICs maintains the operation by the continuous mode is preferable.

In general, a DC-DC converter has operation regions of a continuous mode and discontinuous mode. The continuous mode is an operation mode in which the inductor current flowing to the direction of supplying the current to the load is larger than 0, and the discontinuous mode is an operation mode including a period in which the inductor current flowing to the direction of supplying the current to the load becomes 0.

In particular, if the current becomes small in the case of light load, when the high-side switching element Q1 is OFF and the low-side switching element Q2 is ON, the inductor current becomes zero or negative current in which the current is not supplied to the load, and the operation becomes the discontinuous mode. In the example shown in FIG. 29, when the current (I/Nop) flowing through each of Nop operating power ICs (each of DC-DC converters) becomes $I_0$ or less, the operation becomes the discontinuous mode.

As shown in FIG. 29, in the region that (I/Nop) is $I_0$ or less, the efficiency lowers more and more, and in the region of larger than $I_0$, there is the value Imax of (I/Nop) of maximizing the efficiency. Accordingly, by adjusting the number Nop of the operating power ICs so that each of the power ICs always operate in the continuous mode (so that I/Nop becomes larger than $I_0$), lowering of the efficiency is suppressed and the operation in the vicinity of the maximum efficiency becomes possible.

Moreover, in particular, in the digital control DC-DC converter, the transfer function in the control system is different between the continuous mode and the discontinuous mode, and therefore, the control is required to be changed, but by setting the operating power ICs to be in a state of the continuous mode, the same transfer function can be used for the control system of each of the power ICs, and the control becomes simple.

Sixteenth Embodiment

In the DC-DC converters made to operate in parallel, it is desirable that as described above, the output current of each of the DC-DC converters becomes (I/operation number Nop) when the current flowing through the load is I, but by manufacturing variation or the like despite the power ICs the same structures, there are variations of the internal reference voltage (reference voltage Vref and the offset voltage of the A/D conversion circuit 4, and also, element characteristics such as each of the output FETs (switching elements Q1, Q2) or the LC filter vary, and therefore, unless the output voltage control loop is set to be one and positive current balance control is performed, it is difficult to flow the uniform current through each of the DC-DC converters (each of power ICs).

When each of the power ICs regulates the output (controls the output to the target voltage) by the control loop using its own output voltage control circuit (the comparator 3, the A/D conversion circuit 4, the compensator 5, and so forth), for example only Vref of the power IC 30-1 varies to be higher with respect to the other power ICs 30-2, ... 30-N, almost all of the entire current I comes to concentrate on the DC-DC converter 50-1, and the current flowing through the other DC-DC converters 50-2, . . . 50-N becomes almost zero.

Figure 30:
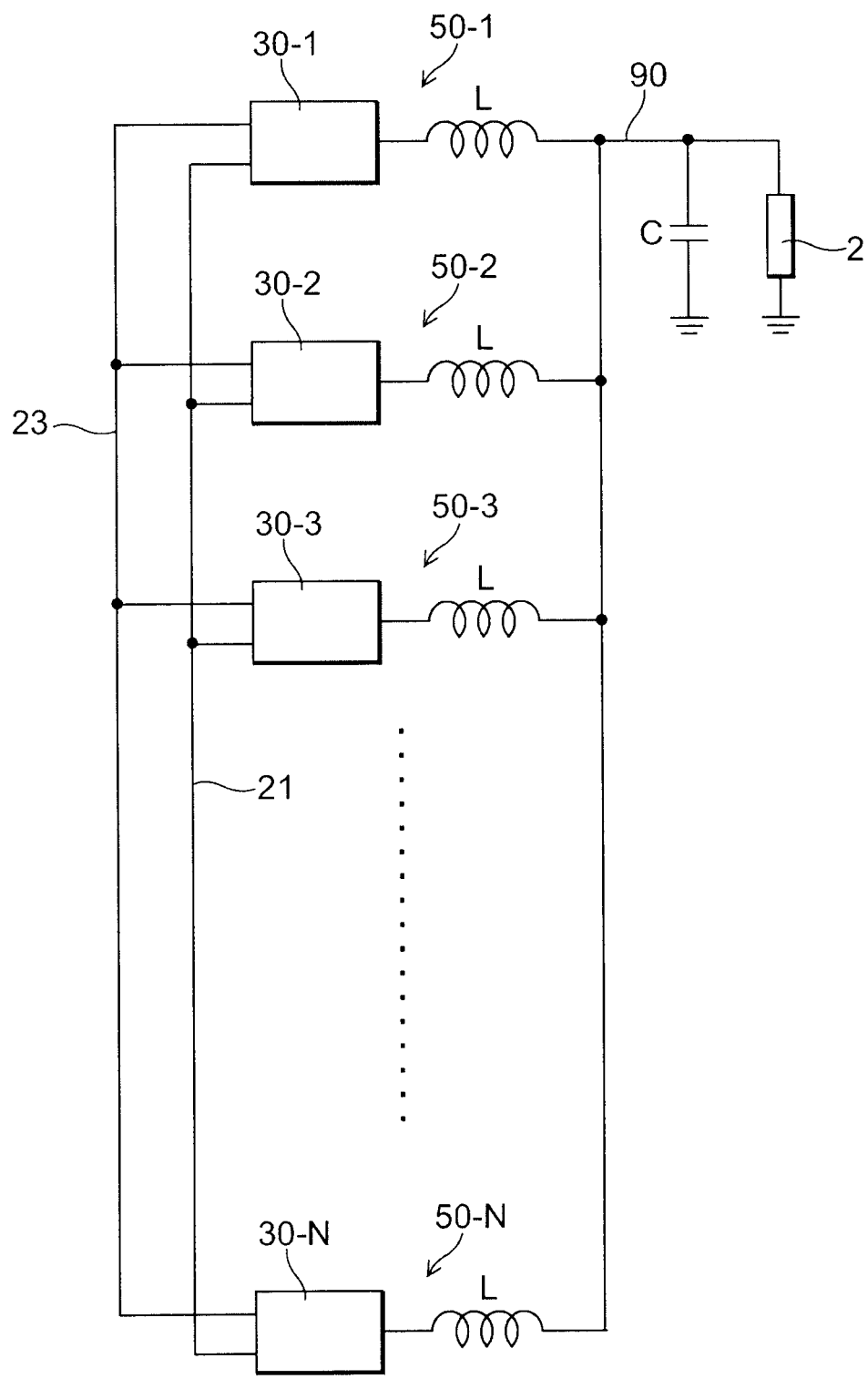
FIG. 30 is a schematic view showing the structure of a digital control power source as a semiconductor device according to a sixteenth embodiment of the invention.

FIG. 30 is a schematic view showing a structure of a digital control power source according to a sixteenth embodiment of the invention. The same signs are appended to the same components as above-described FIG. 27, and the detailed explanation thereof will be omitted.

Each of the power ICs 30-1, 30-2, . . . 30-N are connected in parallel to a common (one) error share bus 23. Each of the operating power ICs controls ON/OFF duty of the switching elements Q1, Q2 on the basis of the error signal e obtained in the error signal generation circuit (the comparator 3, the A/D conversion circuit 4) as explained in the above-described embodiment. In this embodiment, the error signal e obtained in any one of the power ICs is shared and used by the operating entire power IC.

For example, if the power IC 30-1 is made to be the power IC functioning as the master, the power IC 30-1 calculates the duty command value d by the compensator 5 by using the error signal e obtained by its own A/D conversion circuit 4 and controls the output voltage on the basis of the duty command value d, and transmits the error signal e through the error share bus 23 to the other operating power ICs. The other power ICs calculate the duty command value d by the respective compensators 5 on the basis of the error signal e, and control ON/OFF of the switching elements Q1, Q2, and thereby control the output current.

That is, because ON/OFF control of the switching elements Q1, Q2 is performed based on the common error signal e in each of the operating power ICs, independent from the characteristic variation of the error signal generation circuit part (the comparator 3, the A/D conversion circuit 4, and so forth) among the power ICs, the output current can be evenly distributed among the power ICs, and the current can be prevented from concentrating on one Power IC.

Not the error signal e but the duty command value d may be shared and used among the operating entire power ICs. That is, the power IC 30-1 calculates the duty command value d by the compensator 5 by using the error signal e obtained by its own A/D conversion circuit 4 and control the output voltage and transmits the duty command value d through the error share bus 23 to the other operating power ICs. The other power ICs control On/OFF of the respective switching elements Q1, Q2 on the basis of the duty command value d.

Because ON/OFF control of the switching elements Q1, Q2 is performed based on the common duty command value d in each of the operating power ICs, independent from the characteristic variation of the comparator 3 and the A/D conversion circuit 4 and the compensator 5 and so forth among the power ICs, the output current can be evenly distributed among the power ICs, and the current can be prevented from concentrating on one Power IC.

In performing the above-described control, it is necessary to consider the delay time in which the power IC 30-1 functioning as the master calculates the voltage compensation information (the error signal e or the duty command vale d) and then transmits the information to the other operating power IC and then the other power ICs drive ON/OFF of the switching elements Q1, Q2 on the basis of the received voltage compensation information.

Here, in the multiphase operation that each of the power ICs makes the output phases disagree with one another, the power IC 30-1 functioning as the master calculates the above-described voltage compensation information at the times of the number of the operating power ICs (at Nop times) and transmits the voltage compensation information sequentially from smaller phases with respect to the phase 0° of the power IC 30-1, and thereby, the delay time between the timing that the power IC 30-1 transmits the voltage compensation information to the target power IC and the timing that the switching elements Q1, Q2 of the power ICs receiving the information start to switch is suppressed to be small, and thereby, the control response to the target output voltage can be enhanced. And, additionally, by the multiphase operation, power system in which the output ripple is suppressed can be realized.

Moreover, in the transient response, by using not the voltage compensation information from the power IC 30-1 but its own comparator 3 and the A/D conversion circuit 4 and the compensator 5, the error signal e or the duty command value d is calculated to perform the transient response, and thereby, the response property can be more improved. In this case, in the static state, in the power ICs 30-2, . . . 30-N except for the power IC 30-1, it is preferable to adjust the internal reference voltage (reference voltage Vref) so that the error signal e that is the same as the error signal e transmitted from the power IC 30-1 can be generated. Thereby, because the variation of the reference voltage of each of the power IC can be compensated, the error among the phase currents can be smaller.

Seventeenth Embodiment

By the above-described sixteenth embodiment, the output current of each of the power ICs is balanced uniformly to some extent, but the characteristic variation of the output FETs (switching elements Q1, Q2) or the LC filter of each of the power ICs cannot be compensated, and therefore, higher precise current balance control becomes required.

Figure 31:
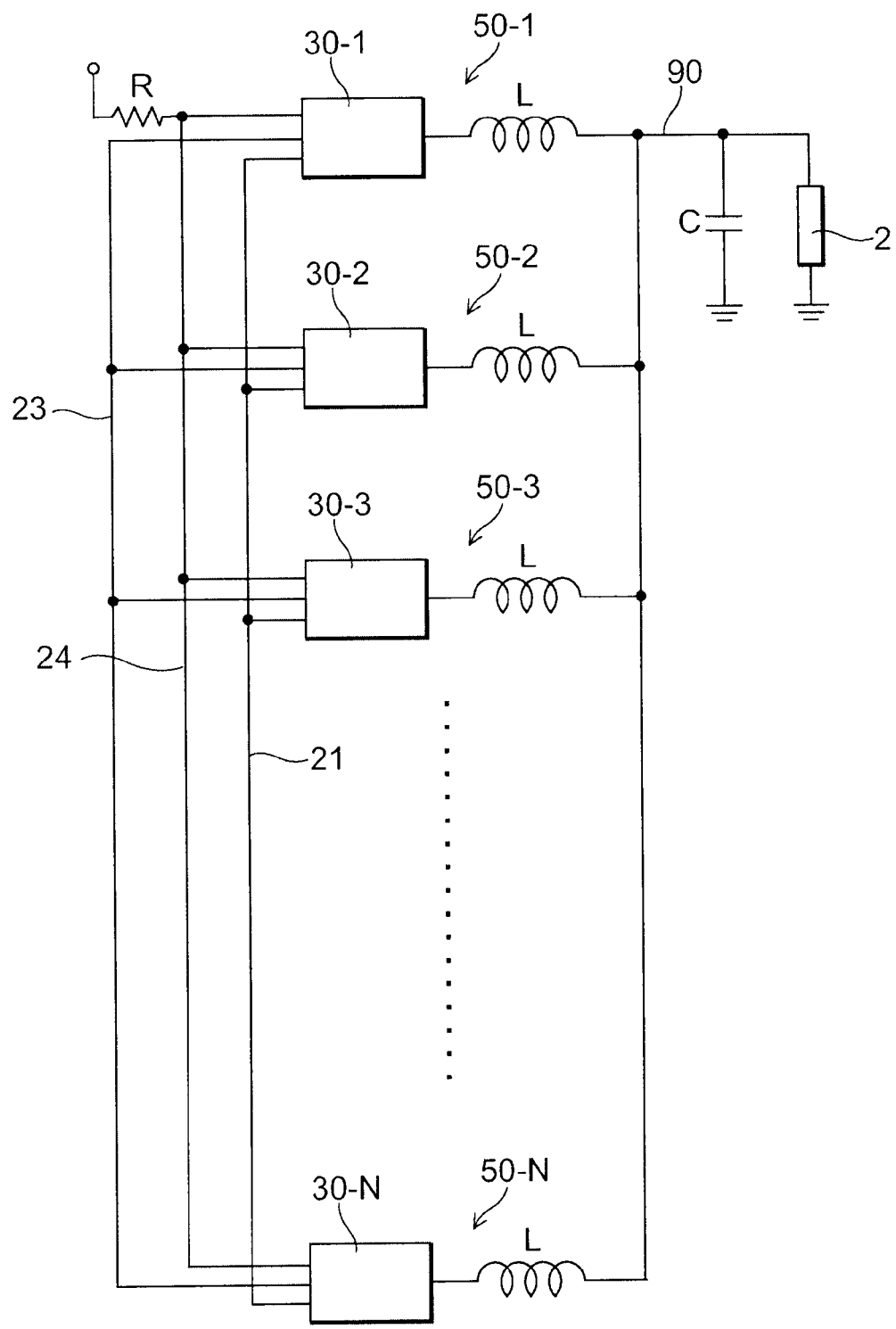
FIG. 31 is a schematic view showing the structure of a digital control power source as a semiconductor device according to a seventeenth embodiment of the invention.

FIG. 31 is a schematic view showing a structure of a digital control power source according to a seventeenth embodiment of the invention. The same signs are appended to the same components as the FIGS. 27 30, and the detailed explanation thereof will be omitted.

In this embodiment, in addition of the above-described synchronization signal line 21 and the error share bus 23, to a common (one) current share bus 24, the power ICs 30-1, 30-2, . . . 30-N are connected in parallel. Each of the power ICs 30-1, 30-2, . . . 30-N transmits and receives the current value data through the current share bus 24 with being synchronized with the clock signal supplied through the synchronization signal line 21.

Figure 32:
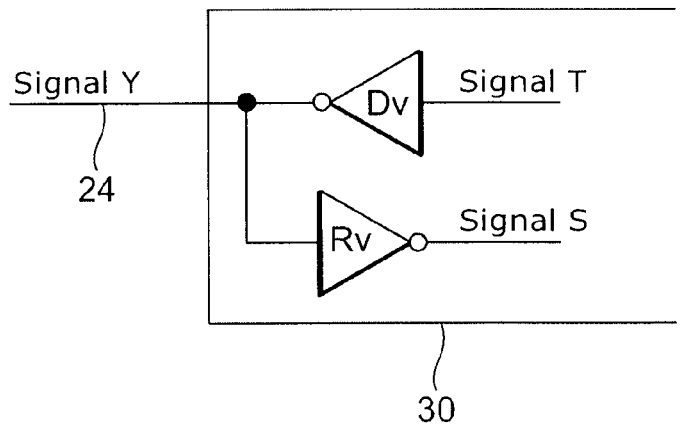
FIG. 32 is a schematic view showing a specific example for a transmit/receive circuit of share current value information provided on each power source IC shown in FIG. 31.

The power ICs 30-1, 30-2, . . . , 30-N have a driver Dv and a receiver Rv connected to the current share bus 24 as shown in FIG. 32. In FIG. 32, each of the power ICs 30-1, 30-2, . . . 30-N is shown representatively by the sign 30.

Figure 33:
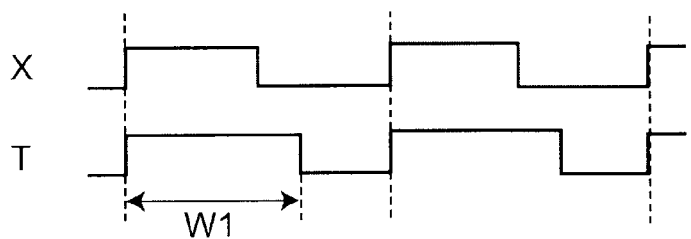
FIG. 33 is a waveform chart showing an example which each IC power source IC shown in FIG. 31 converts its own output current value into a high-level pulse width.

To the driver Dv, the signal T of its own current value converted into a pulse width is input. FIG. 33 shows an example that the current value is converted into the high-level pulse width W1 with being synchronized with the clock signal X. The signal T is inverted in the driver Dv and output to the current share bus 24, and also input to its own receiver Rv.

The driver is a so-called an open drain type. In this embodiment, the open drain output terminal of the driver Dv of each of the power ICs is connected in parallel to the current share bus 24, and additionally, pulled up to the power source by the resistance R shown in FIG. 31, and the function of the negative-logic wired OR (wired OR) is realized. That is, when the driver Dv of any one of the power ICs is outputting "Low", the current share bus 24 becomes in the "Low" level.

This will be explained by using FIG. 34 as the example. Each of the power ICs is synchronized with the signal synchronized with the switching cycle and outputs the pulse signals Y-1, Y-2, . . . Y-n having pulse widths corresponding to the respective current values to the current share bus 24. When the current value is converted to the high-level pulse width W1 like the signal T shown in FIG. 33, the current value is inverted by the driver Dv and therefore the low-level width corresponds to the current value in each of the signals Y-1, Y-2, . . . Y-n.

Figure 34:
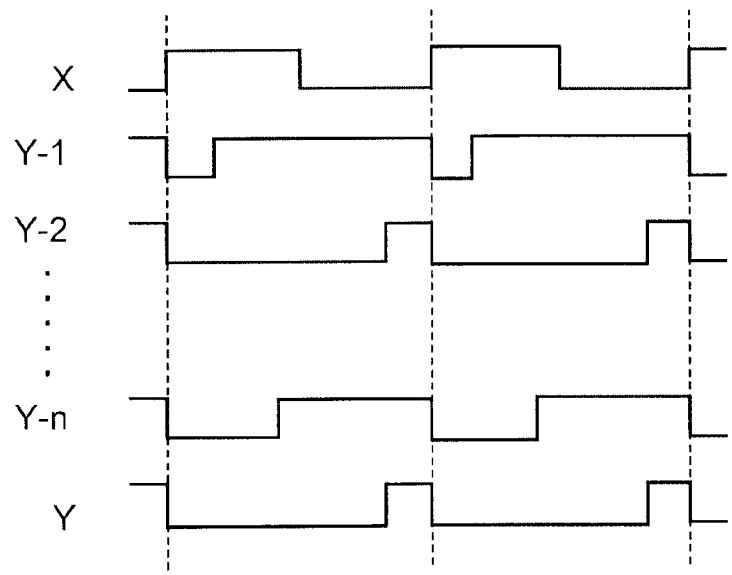
FIG. 34 is a waveform chart for describing a wired OR function in the current share structure shown in FIG. 31.

In the example shown in FIG. 34, because the low-level pulse width of the signal Y-2 is the longest, the signal Y in the current share bus 24 comes to have the same wave shape as the signal Y-2 by the negative logic wired OR, and the common signal Y is input to the receiver Rv of each of the power ICs.

The signal Y is converted in the receiver Rv to be the signal S, and from the high-level pulse width of this signal S, the maximum current value can be detected in the output current values of the respective operating power ICs. That is, each of the operating power ICs can share the maximum current value data as the share current value data.

The minimum current value of the output current values of the operating power ICs may be shared among the power ICs as the share current value data.

Figure 35:
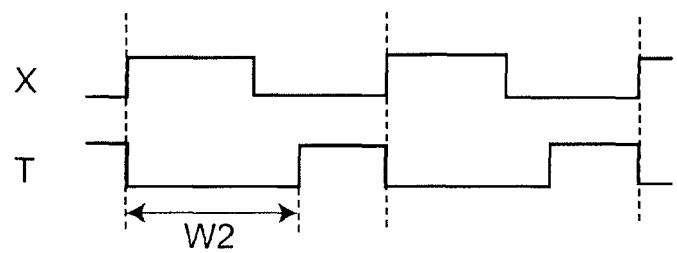
FIG. 35 is a waveform chart showing an example which each IC power source IC shown in FIG. 31 converts its own output current value into a low-level pulse width.

That is, when each of the operating power ICs converts its own current value into the low-level pulse width W2 as shown in FIG. 35, the signal T is inverted by the driver Dv and therefore the high-level width corresponds to the current value in the each of the signals Y-1, Y-2, ... Y-n in FIG. 34.

And, the signal Y comes to have the same wave shape as the signal having the largest low-level pulse width, and conversely, the signal having the smallest high-level pulse width is shared among the power ICs as the signal Y. In this case, because the current value is converted to the high-level width, it corresponds to the minimum current value that the high-level width is the smallest.

In this embodiment, for example, the power ICs are connected in a ring shape to compose a token ring, and the transmission sequence of the current value data is determined on start-up, the power ICs taking in the token (transmission right) are made to sequentially transmit the current value data to the current share bus 24.

The time T required for recognizing the current value data of the entire operating phases can be represented by T=Nphase×Ts/Xphase, in which Nphase is the number of operation phases and Ts is switching period and Xphase is the number of phases of the current value data shared in one switching cycle.

By using the share current value data obtained as described above, each the operating power ICs composes the current compensation loop as shown in FIG. 36 in addition of the above-described voltage compensation loop, and compensates the duty command value d obtained by the voltage compensation loop.

That is, each of the power ICs compares the share current value data obtained through current share bus 24 and the own output current value (inductor current value) iL by the comparator 12, and the comparison result is output to the current compensator 13, and the current compensator 13 calculates the duty compensation value $\Delta d$ on the basis of the comparison result. The $\Delta d$ corresponds to the duty control amount for controlling iL to be the current corresponding to the above-described share current value data.

When the current error that each of the power ICs subtracts its own current value from the share current value is ei, the transfer function Gdi(z) from ei to $\Delta d$ can be exemplified in the following formulas 1-1, 1-2. In this case, b0 to b2 are constants.

$$G_{di}(z) = \frac{b_0 z}{z-1} \quad 1\text{-}1$$

$$G_{di}(z) = \frac{b_0 z^2 + b_1 z + b_2}{z(z-1)} \quad 1\text{-}2$$

When the transfer function Gdi(z) is known, by an inverse z transformation of transforming the transfer function (frequency axis) to a difference equation, the output ($\Delta d$) can be calculated from the input (ei). In the case of Gdi(z) of the above-described formulas 1-1, 1-2, $\Delta d$ becomes the following formulas 2-1, 2-2, respectively. [n] represents the number n of the sample data. In the above-described treatment, after the A/D conversion treatment, the signal is discretized.

$$\Delta d[n] = \Delta d[n-1] + b_0 e[n]$$

$$\Delta d[n] = \Delta d[n-1] + b_0 e[n] + b_1 e[n-1] + b_2 e[n-2]$$

$\Delta d$ calculated by the current compensator 13 is biased in the accumulator 18 with respect to the duty command value d calculated in the voltage compensator 5, and (d+$\Delta d$) is supplied to the digital PWM circuit 6 as the duty command value, if only the current compensation loop is viewed, the control is that the current is uniformed to the maximum current value or the minimum current value among the power ICs, but each of the power ICs individually performs the duty control so that the voltage becomes the target voltage (reference voltage Vref) by the above-described voltage compensation loop, and therefore, by performing the switching control of the switching elements Q1, Q2 on the basis of (d+$\Delta d$), the output current of each of the power ICs is compensated to the direction to becoming smaller (larger) when the current is too large (too small), and therewith, the current is uniformed among the power ICs.

That is, each of the power ICs shares the voltage compensation information (the error signal e or the duty command value d) through the error share bus 23, and thereby the current nonuniformity due to characteristic variation of the compensator 3 and the A/D conversion circuit 4 and the voltage compensator 5 and so forth can be compensated, and additionally, the share current value data is shared through the current share bus 24, and thereby, the current nonuniformity due to characteristic variation of the output FETs (switching elements Q1, Q2) or LC filter can be compensated. As a result, the current balance control among the power ICs can be performed higher-precisely and the current concentration on one power IC can be avoided.

It is not necessary that the current share bus 24 and the error share bus 23 are separated as the hardware, but a common bus can also be used by sectioning the time so that the voltage compensation information is communicated in one time period of the inside of the switching cycle and that the share current value data is communicated in the other time period.

In this embodiment, in sharing the share current value data required for the control to evenly uniform the output current among a plurality of DC-DC converters (power ICs) connected in parallel, high-speed digital bus is not used, and the power consumption is small. Moreover, the reference voltage Vref is not shared among the power ICs, and the increase of the number of the terminals can be suppressed, and furthermore, all of the communications are performed by the digital method, and therefore, are difficult to be affected by the wiring delay.

The abnormal state (error) of the power system includes input overvoltage, input low-voltage, input overcurrent, input overpower, output overvoltage, output low-voltage, output overcurrent, output overpower, output tracking error, over-temperature, low-temperature, nonvolatile memory read error, and so forth.

In recent years, market requirement for power management is enhanced, and it is necessary that the control (power-system protection) methods in the various power system abnormalities can be finely set for each of the abnormal states.

On the other hand, for various errors, the power system can be protected by controlling the output-stage FET. For example, the case that the output overcurrent error and the output overvoltage error are simultaneously caused is thought. When the power IC is set so that the output current is maintained to be constant in the output overcurrent error and so that the output is stopped in the output overvoltage, because the controllable part is only the output-stage FET, the operation simultaneously satisfying the above-described settings cannot be realized and contradiction is caused.

Accordingly, for avoiding this, in the embodiments of this invention, the priority sequence is determined for each of errors in each of the above-described power systems, and when a plurality of errors are caused at the same time, the errors are addressed from higher priority sequence. The priority sequence can be set in the sequence of higher risk for the power system, and can also be programmable through a communication bus or a nonvolatile memory.

As described above, the embodiments of this invention have been explained with reference to the specific examples. However, this invention is not limited thereto, and various modifications based on the technical ideas of this invention are possible.

In the above-described embodiments, the voltage step down DC-DC converter has been exemplified as the digital control power, but this invention is not limited thereto and is applicable to voltage step up DC-DC converter or other voltage conversion circuits. Moreover, the digital PWM circuit of this invention illustrated in FIGS. 1 to 20 is applicable to other applications such as motor driver and LED (Light Emitting Diode).

According to a fourth aspect of the invention, there is provided a semiconductor device comprising: a switching power circuit having a switching element; an error signal generation circuit for detecting an output voltage of the switching power circuit and comparing the output voltage with a target voltage and generating a error signal on the basis of the comparison result thereof; and a digital PWM circuit for supplying a pulse signal whose duty is determined based on the error signal to compensate disagreement of the output voltage with respect to the target voltage, to a control terminal of the switching element, the error signal generation circuit outputting a control parameter determined based on a corresponding relation between a threshold set to have a plurality of stages according to disagreement width with respect to the target voltage and the control parameter set with according to the threshold, a width of the threshold being changed in operating the switching power circuit, and the control parameter changing with corresponding to the change of the width of the threshold.

There is provided a device according to the fourth aspect, wherein when the output voltage becomes larger than the uppermost threshold, the width of the uppermost threshold is changed to be larger.

There is provided a device according to the fourth aspect, wherein when the output voltage becomes smaller than the lowermost threshold, the width of the lowermost threshold is changed to be smaller.

There is provided a device according to the fourth aspect, further comprising a compensator calculating the duty on the basis of the error signal.

According to a fifth aspect of the invention, there is provided a semiconductor device comprising a plurality of digital control power sources having same structures connected in parallel with respect to a common output line, a current flowing each of the operating digital control power sources out of the plurality of digital control power sources being controlled so that each of the operating digital control power sources maintains operation in a continuous mode.

According to a sixth aspect of the invention, there is provided a semiconductor device comprising: a plurality of digital control power sources having same structures connected in parallel with respect to a common output line; and a signal line connected in parallel so that the plurality of digital control power source can communicate with one another, each of the digital control power sources having an output voltage control circuit controlling each of output voltages to be a target voltage, voltage compensation information obtained by the output voltage control circuit of any one of the operating digital control power sources out of the plurality of digital control power sources being shared among all of the operating digital control power sources through the signal line, the operating digital control power sources controlling the output voltage on the basis of the shared voltage compensation information.

There is provided a device according to the sixth aspect, wherein the output voltage control circuit has an error signal generation circuit for detecting the output voltage and comparing the output voltage with the target voltage and generating an error signal corresponding to the disagree amount of the output voltage with respect to the target voltage, and each of the digital control power sources sharing the error signal.

There is provided a device according to the sixth aspect, wherein each of the digital control power sources has a switching element, and the output voltage control circuit has: an error signal generation circuit for detecting the output voltage and comparing the output voltage with the target voltage and generating an error signal corresponding to the disagree amount of the output voltage with respect to the target voltage; and a compensator for calculating duty of pulse signal switching ON/OFF of the switching element on the basis of the error signal, and each of the digital control power sources sharing the duty.

According to a seventh aspect of the invention, there is provided a semiconductor device comprising: a plurality of digital control power sources having same structures connected in parallel with respect to a common output line; and a signal line connected in parallel so that the plurality of digital control power source can communicate with one another, each of the operating digital control power sources outputting current value data of its own output current value converted into a pulse width to the signal line and recognizing the current value data corresponding to the maximum current value or the minimum current value from the current value data of all of the operating digital control power sources as share current value data, and each of the operating digital control power sources controlling the output current on the basis of the share current value data.

There is provided a device according to the seventh aspect, wherein each of the digital control power sources has an open drain output terminal, and the open drain output terminals are connected in parallel to compose wired OR.

There is provided a device according to the seventh aspect, wherein phases of output voltages of digital control power sources disagree with one another.

There is provided a device according to the seventh aspect, wherein any one of the plurality of digital control power sources indicates phase shift values of the respective output voltages to the other digital control power sources.

According to a eighth aspect of the invention, there is provided a semiconductor device comprising a digital PWM circuit outputting: a first pulse signal switching from a low level to a high level at a timing of being synchronized with a clock signal and switching from the high level to the low level at a timing set by a shorter time resolution than that of a period of the clock signal; and a second pulse signal switching from a low level to a high level at a timing set by a shorter time resolution than that of a period of the clock signal and switching from the high level to the low level at a timing set by a shorter time resolution than that of a period of the clock signal, the digital PWM circuit including: a first delay circuit having a plurality of stages of first delay elements connected serially; a first selection circuit selecting one from outputs of the respective delay elements and outputting a signal setting a falling timing of the first pulse signal; a second delay circuit having a plurality of stages of second delay elements connected serially; a second selection circuit selecting one from outputs of the respective second delay elements and outputting a signal setting a rising timing of the second pulse signal; a third delay circuit having a plurality of stages of third delay elements connected serially; and a third selection circuit selecting one from outputs of the respective third delay elements and outputting a signal setting a falling timing of the second pulse signal, a delay amount in the second delay elements being longer than a delay amount in the first delay elements, and a delay amount in the third delay elements being longer than a delay amount in the first delay elements.

There is provided a device according to the eighth aspect, wherein a control current supplied to the second delay elements is smaller than a control current supplied to the first delay elements, and a control current supplied to the second delay elements is smaller than a control current supplied to the third delay elements.

There is provided a device according to the eighth aspect, wherein the number of stages of second delay elements is smaller than the number of stages of first delay elements, and the number of stages of third delay elements is smaller than the number of stages of first delay elements, There is provided a device according to the eighth aspect, wherein an output of the first selection circuit is input to the first-stage second delay element in the second delay circuit.

According to a ninth aspect of the invention, there is provided a semiconductor device comprising a digital PWM circuit outputting: a first pulse signal switching from a low level to a high level at a timing of being synchronized with a clock signal and switching from the high level to the low level at a timing set by a shorter time resolution than that of a period of the clock signal; and a second pulse signal switching from a low level to a high level at a timing set by a shorter time resolution than that of a period of the clock signal and switching from the high level to the low level at a timing set by a shorter time resolution than that of a period of the clock signal, the digital PWM circuit including: a first delay circuit having a plurality of stages of first delay elements connected serially; a first selection circuit selecting one from outputs of the respective delay elements and outputting a signal setting a falling timing of the first pulse signal; a second delay circuit having a plurality of stages of second delay elements connected serially; a second selection circuit selecting one from outputs of the respective second delay elements and outputting a signal setting a rising timing of the second pulse signal; a third delay circuit having a plurality of stages of third delay elements connected serially; and a third selection circuit selecting one from outputs of the respective third delay elements and outputting a signal setting a falling timing of the second pulse signal; an output of the first selection circuit being input to the first-stage second delay element in the second delay circuit.

There is provided a device according to the ninth aspect, wherein the first delay elements, the second delay elements, and the third delay elements have same structures.

The invention claimed is:

1. A semiconductor device comprising:
a switching power circuit comprising a switching element;
an error signal generation circuit configured to detect an output voltage of the switching power circuit, compare the output voltage with a target voltage and generate an error signal on the basis of the comparison result of the output voltage and the target voltage; and
a digital PWM circuit configured to supply a pulse signal whose duty is determined based on the error signal to compensate disagreement of the output voltage with respect to the target voltage, to a control terminal of the switching element,
wherein the error signal generation circuit outputs a control parameter as the error signal, the control parameter determined corresponding to a threshold set to have a plurality of stages according to disagreement width with respect to the target voltage,
a width of the threshold is changed in changing the output voltage, and the control parameter changes with corresponding to the change of the width of the threshold.

2. The device according to claim 1, wherein when the output voltage becomes larger than an uppermost threshold, the width of the uppermost threshold is changed to be larger.

3. The device according to claim 1, wherein when the output voltage becomes smaller than a lowermost threshold, the width of the lowermost threshold is changed to be smaller.

4. The device according to claim 1, further comprising a compensator configured to calculate the duty on the basis of the error signal.

5. A semiconductor device comprising:
a switching power circuit comprising a switching element;
an error signal generation circuit configured to detect an output voltage of the switching power circuit, compare the output voltage with a target voltage and generate a error signal on the basis of the comparison result of the output voltage and the target voltage; and
a digital PWM circuit configured to supply a pulse signal whose duty is determined based on the error signal to compensate disagreement of the output voltage with respect to the target voltage, to a control terminal of the switching element,
wherein the error signal generation circuit outputs a control parameter as the error signal, the control parameter determined corresponding to a threshold set to have a plurality of stages according to disagreement width with respect to the target voltage,
a width of the threshold is changed in operating the switching power circuit, and the control parameter changes with corresponding to the change of the width of the threshold, and
when the output voltage becomes larger than an uppermost threshold, the width of the uppermost threshold is changed to be larger.

6. A semiconductor device comprising:
a switching power circuit comprising a switching element;
an error signal generation circuit configured to detect an output voltage of the switching power circuit, compare the output voltage with a target voltage and generate a error signal on the basis of the comparison result of the output voltage and the target voltage; and
a digital PWM circuit configured to supply a pulse signal whose duty is determined based on the error signal to compensate disagreement of the output voltage with respect to the target voltage, to a control terminal of the switching element, wherein the error signal generation circuit outputs a control parameter as the error signal, the control parameter determined corresponding to a threshold set to have a plurality of stages according to disagreement width with respect to the target voltage, a width of the threshold is changed in operating the switching power circuit, and the control parameter changes with corresponding to the change of the width of the threshold, and when the output voltage becomes smaller than a lowermost threshold, the width of the lowermost threshold is changed to be smaller.

7. The device according to claim 5, wherein the control parameter corresponding to the width of the uppermost threshold changed to be larger are written in a look up table.

8. The device according to claim 7, wherein the output voltage becomes larger than the uppermost threshold, the control parameter corresponding to the width of the uppermost threshold changed to be larger is read from the look up table, and the error signal corresponding to the control parameter is output.

9. The device according to claim 6, wherein the control parameter corresponding to the width of the lowermost threshold changed to be smaller are written in a look up table.

10. The device according to claim 9, wherein the output voltage becomes smaller than the lowermost threshold, the control parameter corresponding to the width of the lowermost threshold changed to be smaller is read from the look up table, and the error signal corresponding to the control parameter is output.

* * * * *